United States Patent
Uemura

(10) Patent No.: US 9,559,655 B2
(45) Date of Patent: Jan. 31, 2017

(54) AMPLIFICATION CIRCUIT

(71) Applicant: KABUSHIKI KAISHA TOSHIBA, Minato-ku, Tokyo (JP)

(72) Inventor: Hiroshi Uemura, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/747,653

(22) Filed: Jun. 23, 2015

(65) Prior Publication Data

US 2016/0204753 A1 Jul. 14, 2016

(30) Foreign Application Priority Data

Jan. 13, 2015 (JP) .................... 2015-004334

(51) Int. Cl.
| | | |
|---|---|---|
| H04B 10/06 | (2006.01) | |
| H03G 3/30 | (2006.01) | |
| H04B 10/564 | (2013.01) | |
| H04B 10/60 | (2013.01) | |
| H03F 3/45 | (2006.01) | |

(52) U.S. Cl.
CPC ........ *H03G 3/3084* (2013.01); *H03F 3/45183* (2013.01); *H04B 10/564* (2013.01); *H04B 10/60* (2013.01); *H03F 2200/102* (2013.01); *H03F 2203/45674* (2013.01)

(58) Field of Classification Search
CPC ......... H04B 10/60; H04B 10/40; H04B 10/43; H04B 10/693; H04B 10/6931; H04B 10/2507; H04B 10/50593; H04B 10/6933
USPC .............. 398/202, 208, 209, 135, 136, 137, 138,398/139, 182, 193, 194, 158, 159; 330/59, 308; 250/214 A, 214 LA, 214 AG
See application file for complete search history.

(56) References Cited

U.S. PATENT DOCUMENTS

| 6,169,619 B1 * | 1/2001 | Ide ..................... H04B 10/6931 250/214 AG |
| 2006/0067712 A1 * | 3/2006 | Draper .................. H03F 1/0277 398/208 |
| 2008/0107424 A1 * | 5/2008 | Tonietto ........... G11B 20/10009 398/136 |

(Continued)

FOREIGN PATENT DOCUMENTS

| JP | 05075544 A | 3/1993 |
| JP | 11205055 A | 7/1999 |

(Continued)

OTHER PUBLICATIONS

Japanese Office Action (and English translation thereof) dated Mar. 29, 2016, issued in counterpart Japanese Application No. 2015-004334.

*Primary Examiner* — Hanh Phan
(74) *Attorney, Agent, or Firm* — Holtz, Holtz & Volek PC

(57) ABSTRACT

According to one embodiment, an amplification circuit includes an amplifier having a gain and amplifying the input signal based on the gain, and a gain control signal generator controlling the gain based on an amplitude of the input signal. The gain obtained when the amplitude of the input signal is less than a first amplitude and when the amplitude of the input signal is greater than a second amplitude is lower than the gain obtained when the amplitude of the input signal is between the first and second amplitudes or when the amplitude of the input signal is one of the first and second amplitudes. The second amplitude is greater than or equal to the first amplitude.

19 Claims, 19 Drawing Sheets

(56) References Cited

U.S. PATENT DOCUMENTS

2008/0189641 A1* 8/2008 Kotturu .................. H04L 43/18
715/771

FOREIGN PATENT DOCUMENTS

| JP | 2007081599 A | 3/2007 |
| JP | 2010141589 A | 6/2010 |
| JP | 2012170132 A | 9/2012 |

* cited by examiner

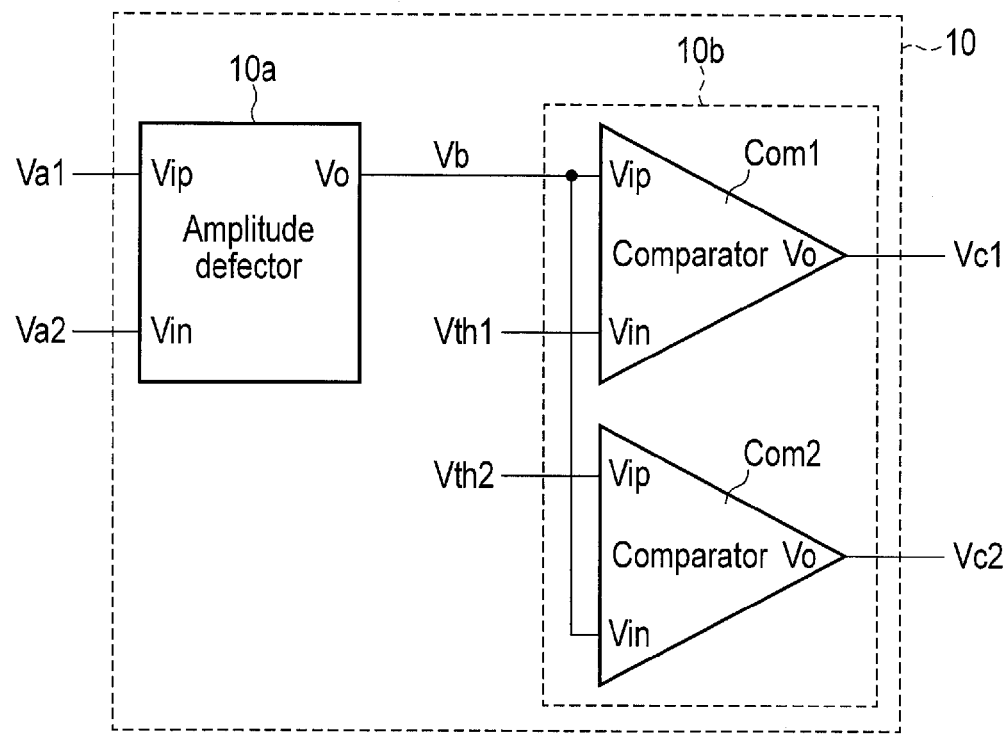
F I G. 3
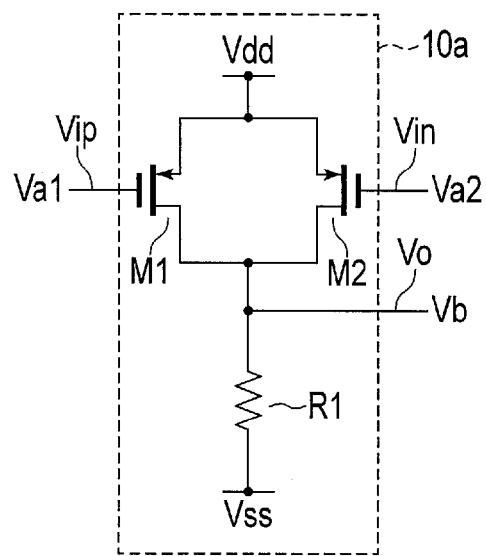
F I G. 4

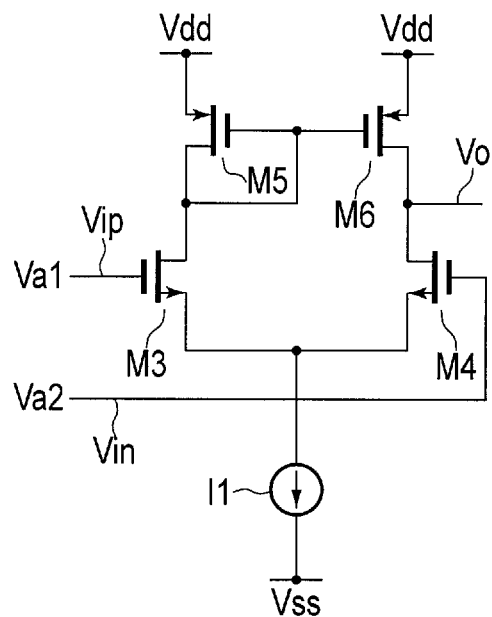
F I G. 5
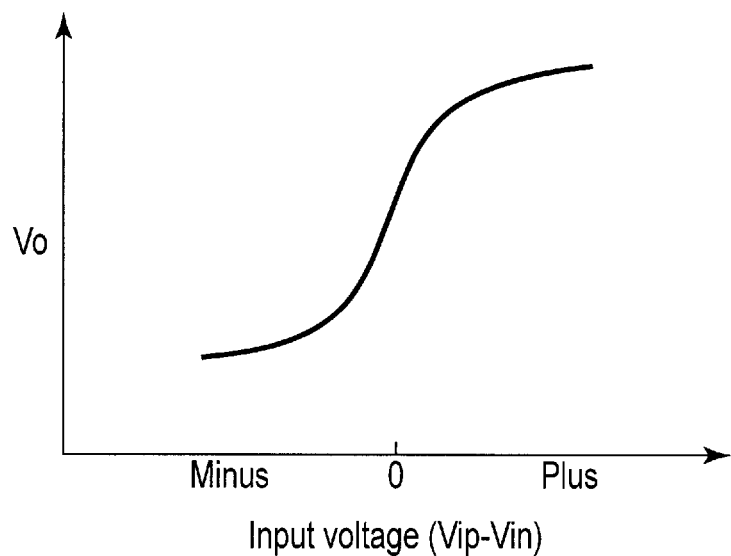
F I G. 6

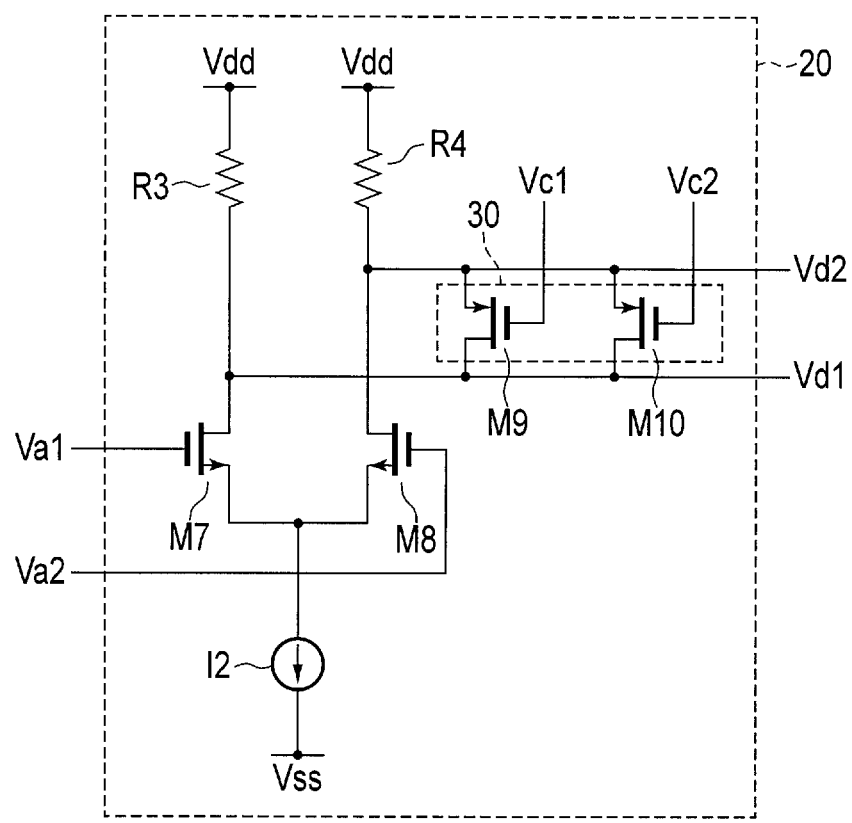
F I G. 7

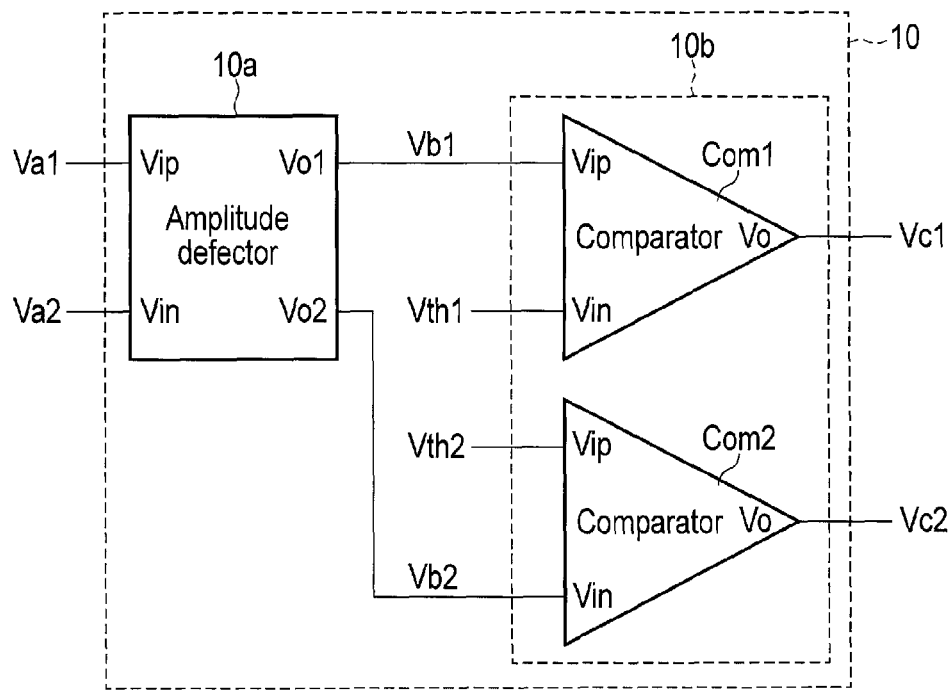
F I G. 12
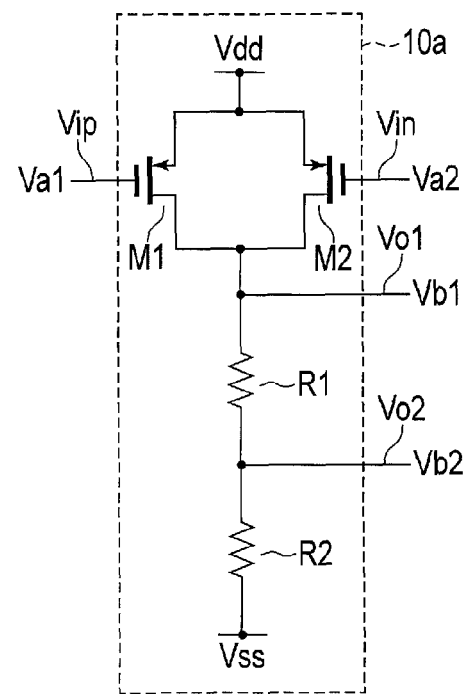
F I G. 13

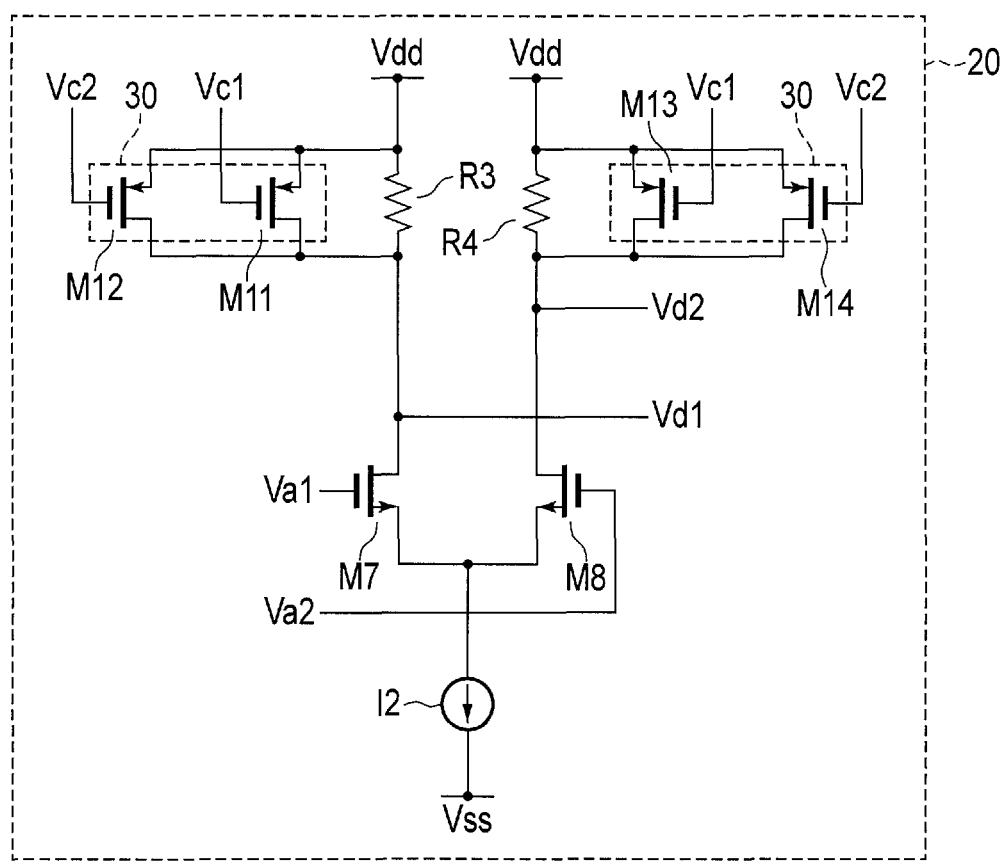
F I G. 15

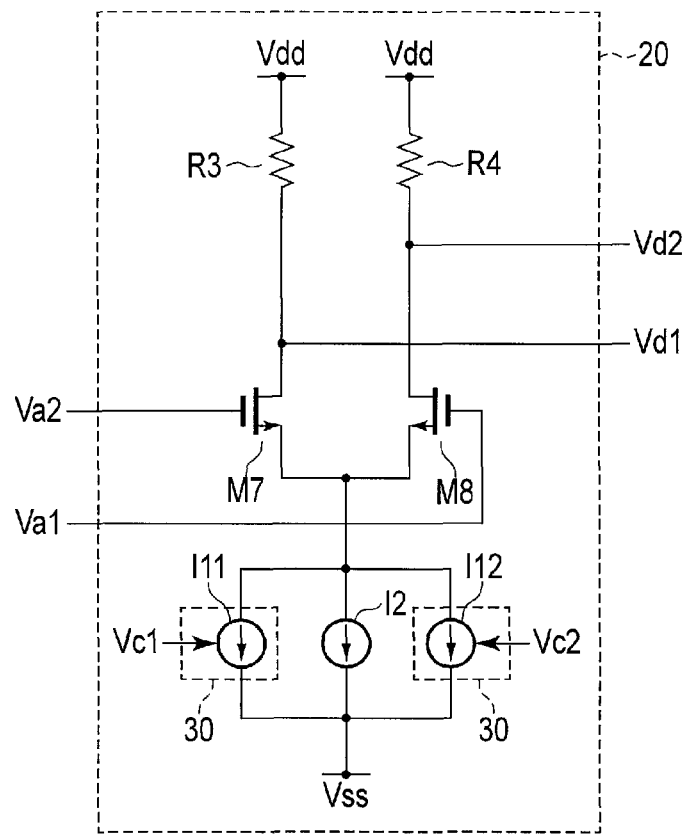
F I G. 16
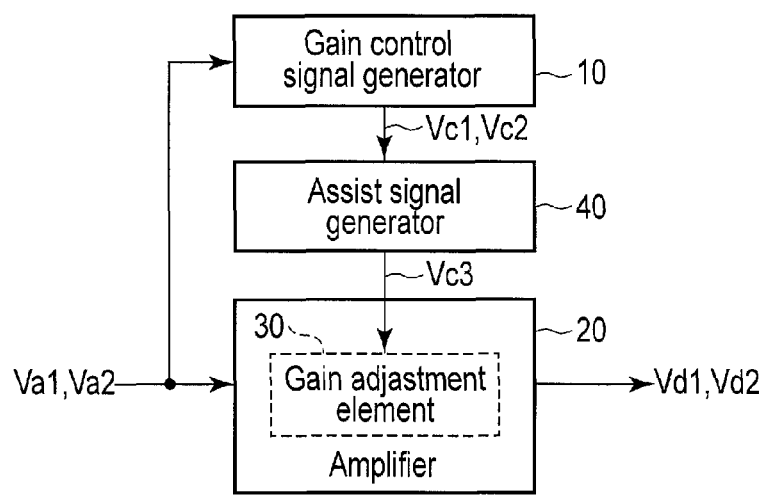
F I G. 17

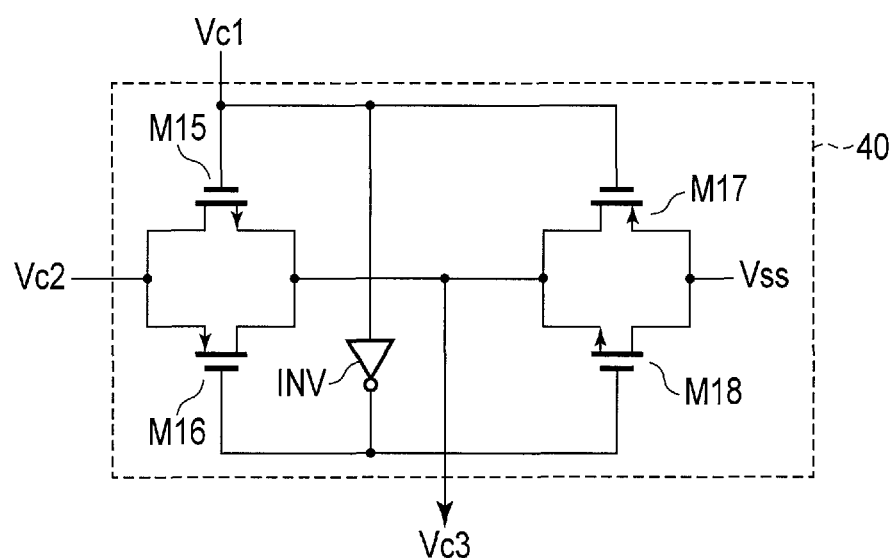
F I G. 18

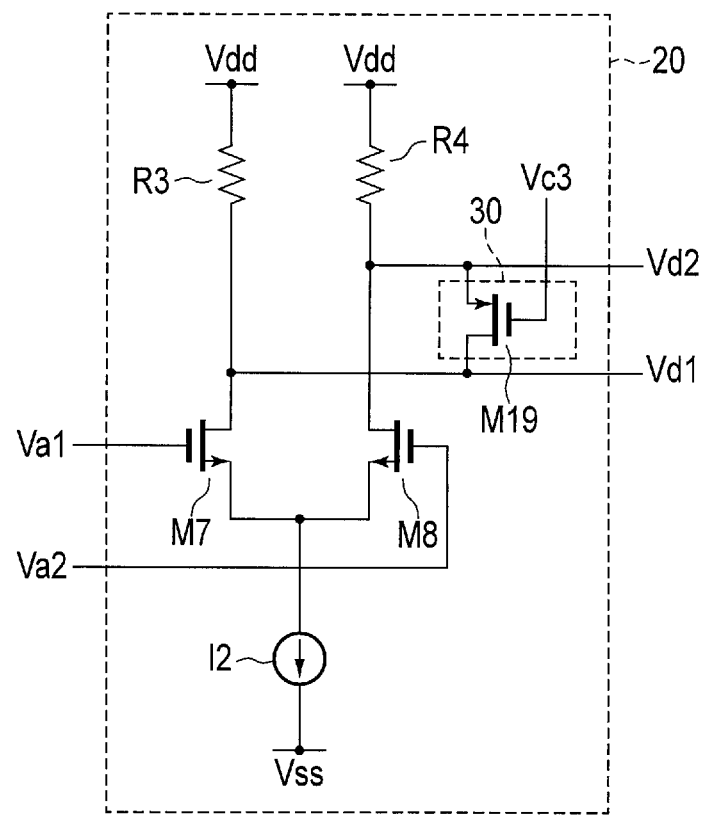
F I G. 20
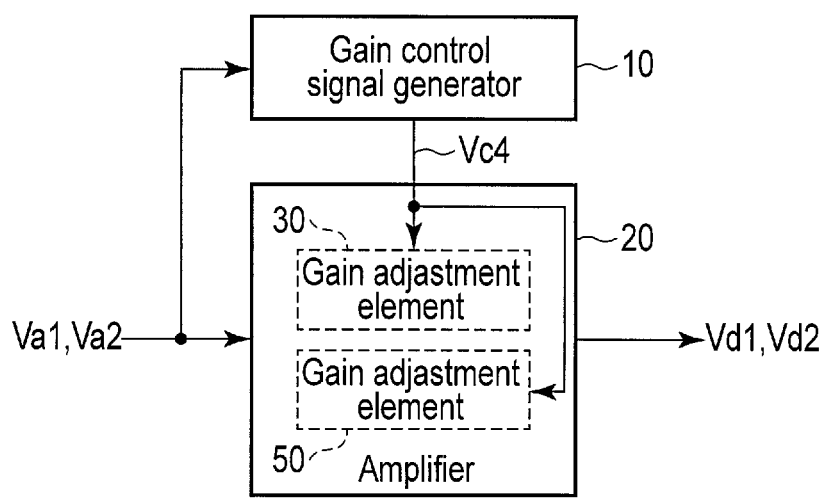
F I G. 21

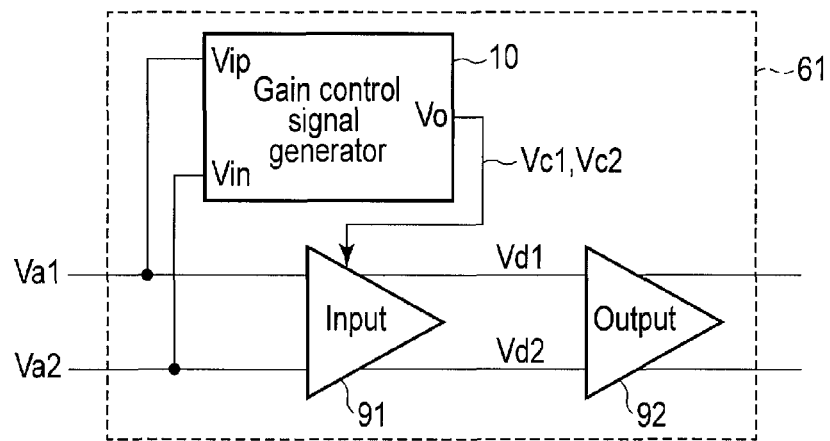
F I G. 24
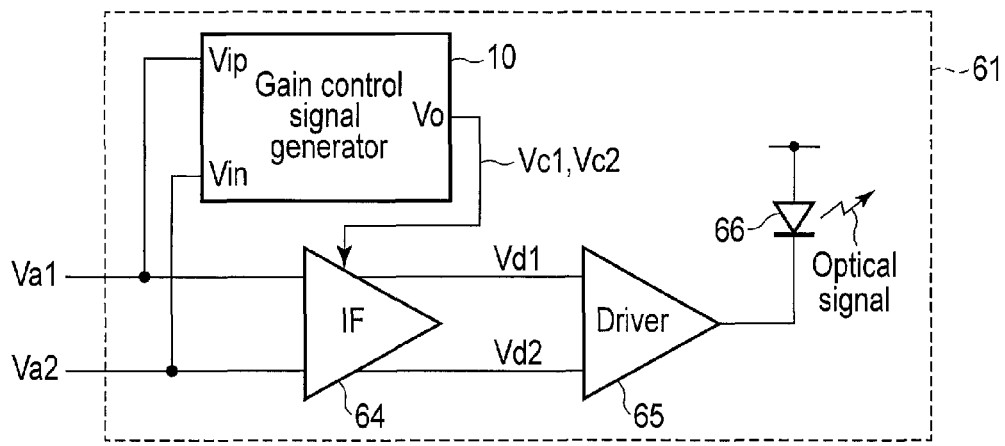
F I G. 25
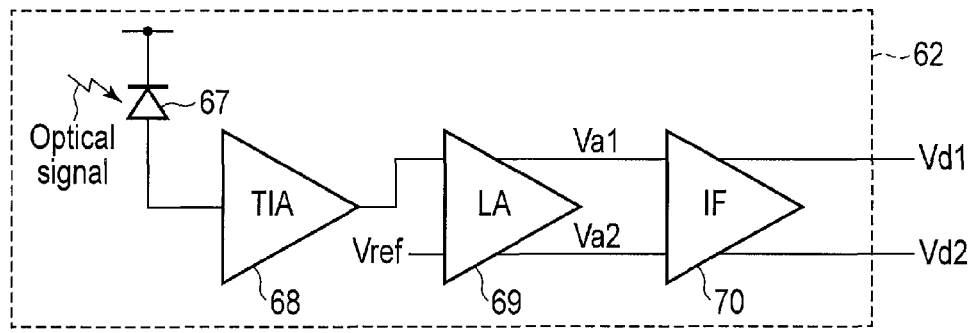
F I G. 26

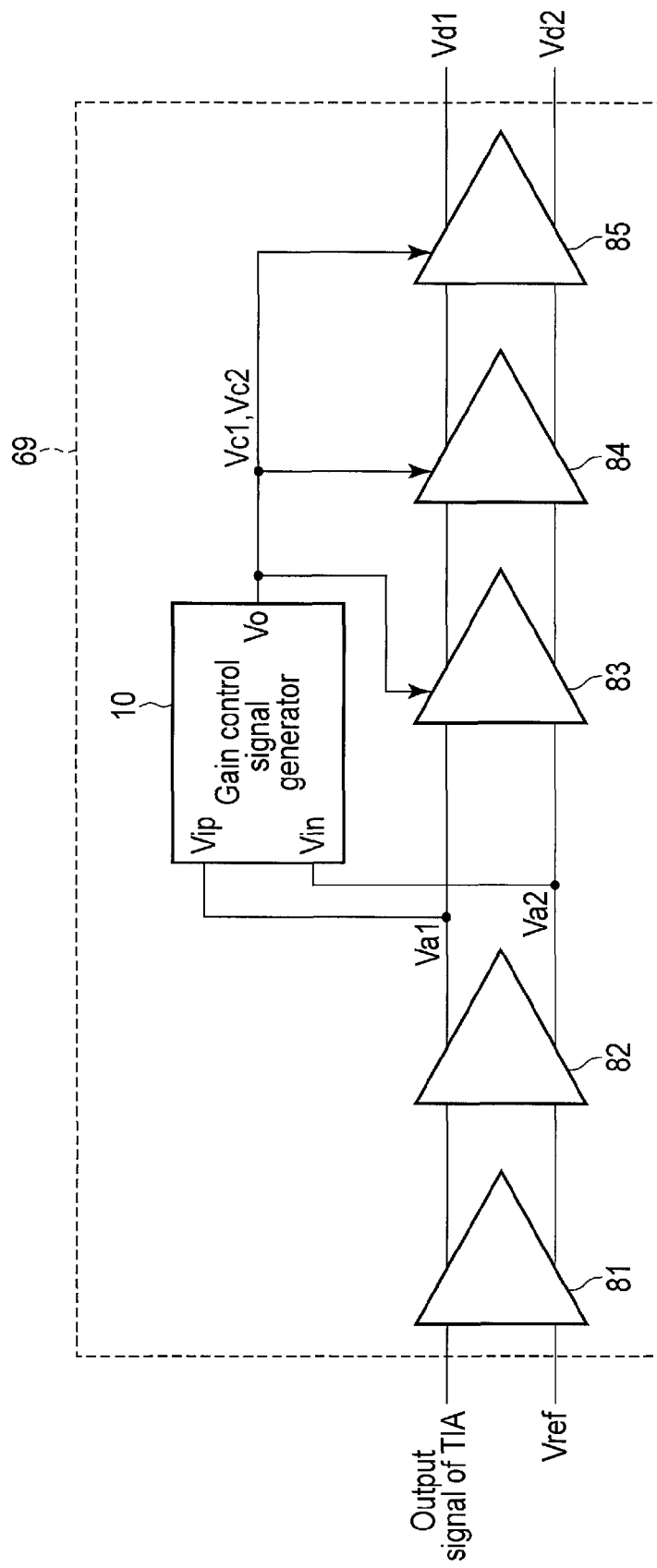
F I G. 27

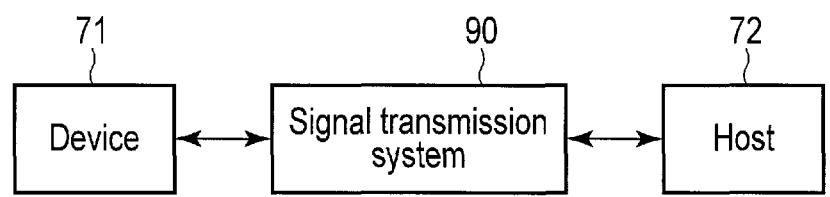
F I G. 28

AMPLIFICATION CIRCUIT

CROSS-REFERENCE TO RELATED APPLICATIONS

This application is based upon and claims the benefit of priority from Japanese Patent Application No. 2015-004334, filed Jan. 13, 2015, the entire contents of which are incorporated herein by reference.

FIELD

Embodiments described herein relate generally to an amplification circuit.

BACKGROUND

As information technology progresses and technical advances are made in electronic devices, data communication devices have been steadily improving in signal transmission speed. As a result, there is increasing demand for an amplifier for high-speed signal transmission.

BRIEF DESCRIPTION OF THE DRAWINGS

FIG. 3 is a diagram showing an example of a gain control signal generator.

FIG. 4 is a diagram showing an example of an amplitude detector.

FIG. 5 is a diagram showing an example of a comparator.

FIG. 6 is a diagram showing an example of the input and output characteristics of the comparator of FIG. 5.

FIG. 7 is a diagram showing an example of an amplifier.

FIG. 12 is a diagram showing a modified example of the gain control signal generator.

FIG. 13 is a diagram showing a modified example of the amplitude detector.

FIG. 15 is a diagram showing a modified example of the amplifier.

FIG. 16 is a diagram showing another modified example of the amplifier.

FIG. 17 is a diagram showing an amplification circuit of the second embodiment.

FIG. 18 is a diagram showing an example of an assist signal generator.

FIG. 20 is a diagram showing an example of the amplifier.

FIG. 21 is a diagram showing an amplification circuit of the third embodiment.

FIG. 24 is a diagram showing a transmitter for electrical signal transmission.

FIG. 25 is a diagram showing a transmitter for optical signal transmission.

FIG. 26 is a diagram showing a receiver for optical signal transmission.

FIG. 27 is a diagram showing an example of the interior structure of a limiting amplifier.

FIG. 28 is a diagram showing a storage system as an application example.

DETAILED DESCRIPTION

In general, according to one embodiment, an amplification circuit comprises: an amplifier having a gain and amplifying an input signal based on the gain; and a gain control signal generator controlling the gain based on an amplitude of the input signal. The gain obtained when the amplitude of the input signal is less than a first amplitude or when the amplitude of the input signal is greater than a second amplitude is lower than the gain obtained when the amplitude of the input signal is between the first and second amplitudes or when the amplitude of the input signal is one of the first and second amplitudes. The second amplitude is greater than or equal to the first amplitude.

Embodiments will be described hereinafter with reference to the accompanying drawings.

(1) First Embodiment

Figure 1:
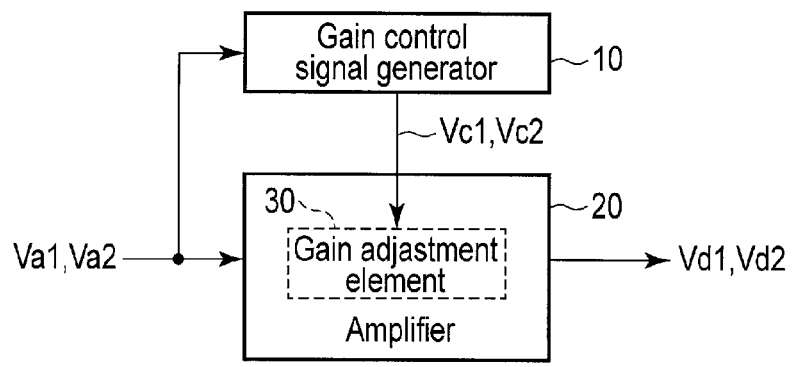
FIG. 1 is a diagram showing an amplification circuit of the first embodiment.

FIG. 1 is a diagram showing an amplification circuit of the first embodiment.

Input signals Va1 and Va2 are input to a gain control signal generator 10 and an amplifier 20.

Figure 2A:
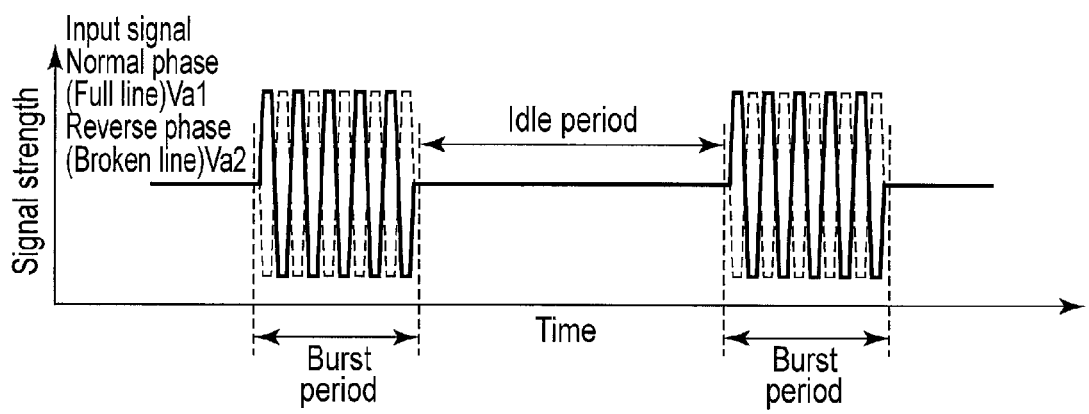
FIGS. 2A and 2B are diagrams showing examples of an input signal.

Input signals Va1 and Va2 are, for example, repetitious burst signals (voltage signals) including a burst period in which the signals transition between low and high repeatedly and an idle period in which the signals remain unchanged at an intermediate level between low and high as shown in FIG. 2A.

Figure 2B:
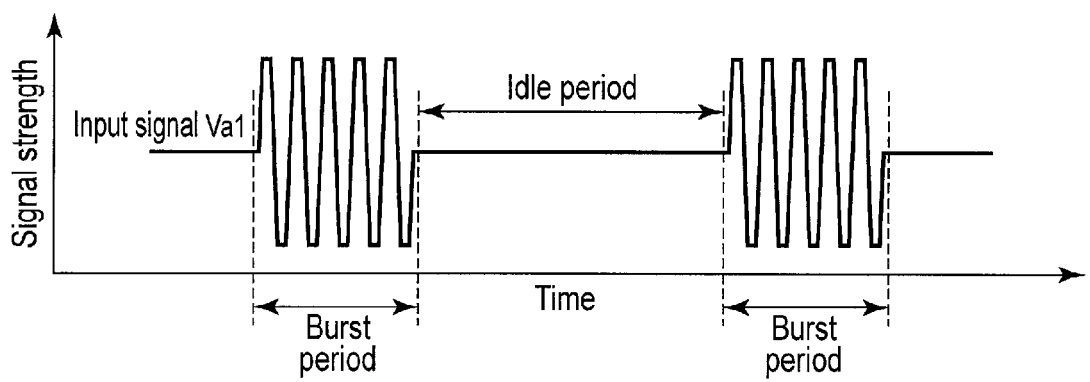

In this embodiment, the input signal is assumed to be a differential signal. In this case, for example, input signal Va1 is a normal phase signal Va1 and input signal Va2 is a reverse phase signal Va2 the phase of which is the inverse of that of the normal phase signal Va1 as shown in FIG. 2A. Note that the input signal is not necessarily limited to the above-described differential signal, and if the input signal is a single-ended (single-phase) signal, for example, only input signal Va1 is input to the amplifier 20 as shown in FIG. 2B.

The gain control signal generator 10 is configured to generate first and second gain control signals Vc1 and Vc2 based on input signals Va1 and Va2. The amplifier 20 is configured to amplify input signals Va1 and Va2 based on the gain controlled by the first and second gain control signals Vc1 and Vc2 and output signals Vd1 and Vd2.

For example, the amplifier 20 comprises a gain adjustment element 30. The gain adjustment element 30 is configured to change the gain of the amplifier 20 based on the first and second gain control signals Vc1 and Vc2.

<Example of Gain Control Signal Generator>

FIG. 3 is a diagram showing an example of the gain control signal generator.

The gain control signal generator 10 comprises an amplitude detector 10a configured to detect the amplitude of input signals Va1 and Va2, and a comparator 10b configured to output the first and second gain control signals Vc1 and Vc2 based on an output signal (detection signal) Vb of the amplitude detector 10a and on first and second reference values Vth1 and Vth2. The comparator 10b comprises first and second comparators Com1 and Com2. Each of the first and second comparators Com1 and Com2 comprises two input terminals Vip and Vin and one output terminal Vo.

Note that, in the present embodiment, the following descriptions are based on the assumption that the first reference value Vth1 is less than the second reference value Vth2, but they are not necessarily limited to have this relationship. The first reference value Vth1 may be equal to the second reference value Vth2, or the first reference value Vth1 may be greater than the second reference valve Vth2.

<Example of Amplitude Detector>

FIG. 4 is a diagram showing an example of the amplitude detector.

The amplitude detector 10a comprises, for example, PMOS transistors M1 and M2 and resistor R1 which are connected between two power-supply terminals Vdd and Vss, and constitutes an OR circuit of PMOS transistors.

The power-supply terminal Vdd provides, for example, a power-supply voltage (1.2V). The power-supply terminal Vss provides, for example, a ground voltage (0V). Further, the gate (control terminal) of PMOS transistor M1 is connected to the input terminal Vip to which input signal Va1 is input. The gate of PMOS transistor M2 is connected to the input terminal Vin to which input signal Va2 is input. The detection signal Vb is output from the output terminal Vo provided between PMOS transistors M1 and M2 and resistor R1.

Figure 8A:
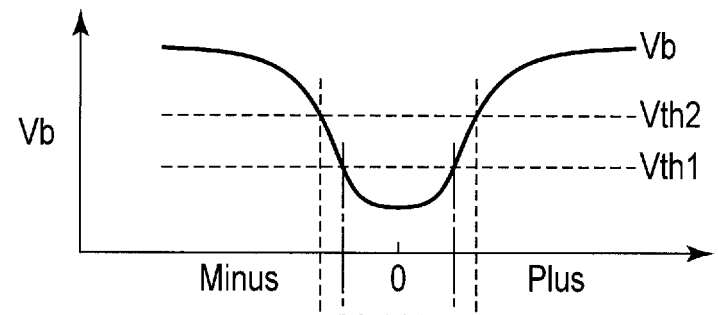
FIGS. 8A, 8B and 8C are diagrams showing the relationships among an amplitude detection value, a gain control signal and an amplifier gain.

An example of the input and output characteristics of the amplitude detector 10a of FIG. 4 is shown in FIG. 8A.

Regardless of whether an input voltage (Va1-Va2) changes positively or negatively from zero, an output voltage Vb increases. Here, since input signals Va1 and Va2 are differential signals, the input voltage (Va1-Va2) changes between the first value and the second value having an absolute value the same as that of the first value and a sign reversed with that of the first value. Although output voltage Vb changes to follow the change of the input voltage, if the operating band of the amplitude detector 10a is lower than the signal bands of input signals Va1 and Va2, it becomes possible to make output voltage Vb substantially a constant value based on the above-described first and second values. That is, the amplitude detector 10a can be operated as a circuit configured to detect the amplitude of the differential input signals.

Note that the amplitude detector 10a of FIG. 4 may comprise an NMOS transistor the gate of which has been subjected to a predetermined bias voltage in place of resistor R1. Further, if the input signal is a single-ended signal, it is desirable that the input signal be converted from a single-ended signal into a differential signal and then input to the amplitude detector 10a of FIG. 4.

The amplitude detector 10a of the present embodiment uses an OR circuit composed of PMOS transistors, but the amplitude detector 10a is not necessarily limited to this and may use, for example, an OR circuit composed of NMOS transistors. That is, the amplitude detector 10a may comprise a resistor on the power-supply voltage side and two NMOS transistors provided in parallel on the ground side. However, in this case, in contrast to the OR circuit composed of PMOS transistors, the output decreases as the amplitude of the differential input signals increases. Therefore, it is necessary to appropriately configure the comparator 10b, the amplifier 20 and the gain adjustment element 30 to perform amplifier gain adjustment which will be described later.

<Example of Comparator>

FIG. 5 is a diagram showing an example of a comparator.

The comparator is an example of the first and second comparators Com1 and Com2 of FIG. 3. The comparator is a differential amplifier comprising NMOS transistors M3 and M4 as input transistors, PMOS transistors M5 and M6 connected in a current-mirror fashion as loads, and current source I1.

The gate of NMOS transistor M3 is connected to input terminal Vip, and the gate of NMOS transistor M4 is connected to input terminal Vin. Further, the drain of NMOS transistor M4 and the drain of PMOS transistor M6 are connected to the output terminal Vo. Current source I1 is composed, for example, of an NMOS transistor the gate of which has been subjected to a predetermined bias voltage.

FIG. 6 is a diagram showing an example of the input and output characteristics of the comparator of FIG. 5.

According to the present embodiment, as the input voltage (Vip-Vin) increases, output voltage Vo increases, and as the input voltage (Vip-Vin) decreases, output voltage Vo decreases. That is, the comparator of FIG. 5 can be operated as a circuit configured to output the result of a comparison between the two input terminals Vip and Vin.

Note that the first comparator Com1 of FIG. 3 receives the detection signal Vb from the amplitude detector 10a by input terminal Vip, receives the first reference value Vth1 by input terminal Vin, and outputs the first gain control signal Vc1 from the output terminal Vo.

Figure 8B:
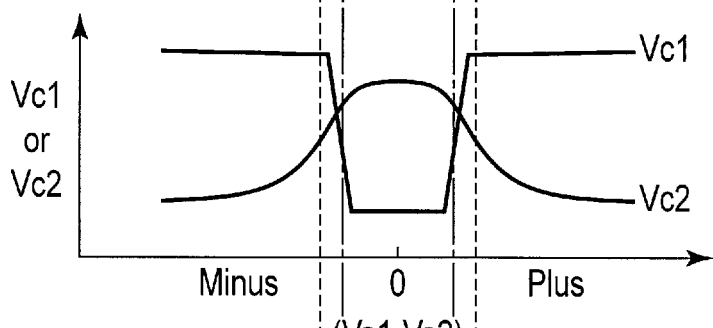

With this configuration, for example, as shown in FIGS. 8A and 8B, when the detection signal Vb changes from a value less than the first reference value Vth1 to a value greater than the first reference value Vth1, the first gain control signal Vc1 increases.

Further, the second comparator Com2 of FIG. 3 receives the detection signal Vb from the amplitude detector 10a by input terminal Vin, receives the second reference value Vth2 by input terminal Vip, and outputs the second gain control signal Vc2 from the output terminal Vo.

With this configuration, for example, as shown in FIGS. 8A and 8B, when the detection signal Vb changes from a value less than the second reference value Vth2 to a value greater than the second reference value Vth2, the second gain control signal Vc2 decreases.

Note that the terminal which inputs the detection signal Vb and the terminals which input the first and second reference values Vth1 and Vth2 (Vip, Vin) may be switched with each other. In that case, however, the changes in the voltage of the first and second gain control signals Vc1 and Vc2 with respect to the change in the detection signal Vb occur in directions opposite to those of the above-described example. Therefore, it is necessary to appropriately configure the amplitude detector 10a, the amplifier 20, and the gain adjustment element 30 to perform amplifier gain adjustment which will be described later.

Further, the comparator 10b may be a differential amplifier comprising PMOS transistors as input transistors and NMOS transistors connected in a current-mirror fashion as loads. In that case, it is also necessary to appropriately configure the amplitude detector 10a, the amplifier 20, and the gain adjustment element 30 to perform amplifier gain adjustment which will be described later.

<Example of Amplifier>

FIG. 7 is a diagram showing an example of the amplifier.

The amplifier 20 is of a differential input type and comprises NMOS transistors M7 and M8 configured to receive input signals Va1 and Va2, resistors R3 and R4, and current source 12. Output signals Vd1 and Vd2 are output from the drains of NMOS transistors M7 and M8. Note that, when the input signal is a single-ended signal, a reference voltage may be input to NMOS transistor M8 or the input signal may be converted from a single-ended signal into a differential signal in a stage prior to that of the amplifier 20 and then input to the amplifier 20.

The amplifier 20 further comprises the first gain adjustment element M9 configured to change the gain by the first gain control signal Vc1 and the second gain adjustment element M10 configured to change the gain by the second gain control signal Vc2. Each of the first and second gain adjust elements 30 (M9 and M10) is a PMOS transistor connected between the drains of NMOS transistors M7 and M8. The first gain control signal Vc1 is input to the gate of the first gain adjustment element M9, and the second gain control signal Vc2 is input to the gate of the second gain adjustment element M10.

The resistance between the source and the drain of each of the first and second gain adjustment elements 30 (M9 and M10) changes based on the voltage in the gate. More specifically, as the voltage in the gate decreases, the resistance between the source and the drain decreases, and as the voltage in the gate increases, the resistance between the source and the drain increases.

Here, the gain of the amplifier 20 (more specifically, a change in the output signal when the input signal is changed slightly, namely, a small-signal gain) is roughly determined by multiplying a load resistance relying on the resistances of resistors R3 and R4, the resistances between the drains and the sources of the first and second gain adjustment elements 30 (M9 and M10) and the output resistances of NMOS transistors M7 and M8, by the transconductance of NMOS transistors M7 and M8 (the changes in the drain currents when the gate voltages are changed slightly).

Therefore, as the voltages in the gates of the first and second gain adjustment elements 30 (M9 and M10) decrease, the load resistance of the amplifier 20 decreases and the gain thereof similarly decreases. Further, as the voltages in the gates increase, the load resistance of the amplifier 20 increases and the gain thereof similarly increases.

In the present embodiment, for example, as shown in FIGS. 8A and 8B, when the detection signal Vb is less than the first reference value Vth1, the first gain control signal Vc1 decreases while the second control signal Vc2 is maximum or increases toward maximum.

Figure 8C:
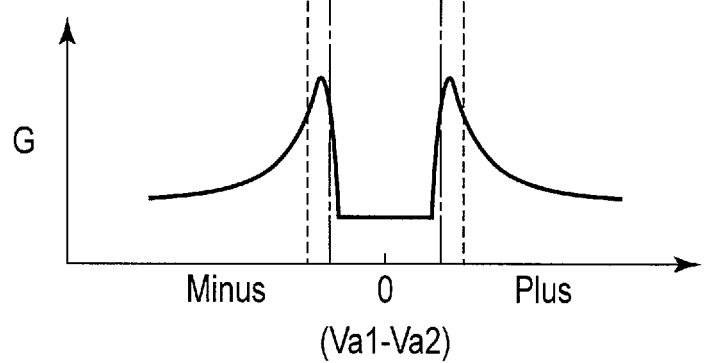

That is, the resistance between the source and the drain of the first gain adjustment element M9 becomes low while the resistance between the source and the drain of the second gain adjustment element M10 is maximum or increases toward maximum. However, since the first and second gain adjustment elements M9 and M10 are connected in parallel, the combined resistance becomes low eventually. That is, as shown in FIG. 8C, the gain (G) of the amplifier 20 becomes low.

Next, when the detection signal Vb is greater than the second reference value Vth2, the first gain control signal Vc1 is maximum or increases toward maximum while the second gain control signal Vc2 decreases. That is, the resistance between the source and the drain of the first gain adjustment element M9 is maximum or increases toward maximum while the resistance between the source and the drain of the second gain adjustment element M10 becomes low. However, since the first and second gain adjustment elements M9 and M10 are connected in parallel, the combined resistance becomes low eventually. That is, the gain of the amplifier 20 becomes low.

When the detection signal Vb is between the first and second reference values Vth1 and Vth2, the combined resistance of the first and second gain adjustment elements M9 and M10 is higher than the combined resistance obtained when the detection signal Vb is less than the first reference value Vth1 or when the detection signal Vb is greater than the second reference value Vth2. Therefore, the gain of the amplifier 20 becomes high in this range.

In this way, it is possible to make the gain of the amplifier 20 obtained when the detection signal Vb is less than the first reference value Vth1 or when the detection signal Vb is greater than the second reference value Vth2 lower than the gain of the amplifier obtained when the detection signal Vb is between the first and second reference values Vth1 and Vth2.

The gain of the amplifier 20 peaks, for example, in a range between the first and second reference values Vth1 and Vth2 as shown in FIG. 8C. Note that the gain of the amplifier 20 does not necessarily have a peak and may become flat (constant value) around the maximum or may have fluctuations relatively small as compared to the total change in the gain.

In the present embodiment, PMOS transistors are used as the first and second gain adjustment elements 30, but for example, NMOS transistors may be used as well. In that case, however, in contrast to the case of using PMOS transistors as the gain adjustment elements, as the first and second gain control signals Vc1 and Vc2 increase, the gain of the amplifier 20 decreases. Therefore, it is necessary to appropriately configure the amplitude detector 10a and the comparator 10b to perform the above-described gain adjustment of the amplifier.

The amplifier 20 of the present embodiment is assumed to be a differential amplifier shown in FIG. 7 but not necessarily be limited to this, and the amplifier 20 may comprise a plurality of amplifiers inside. Further, in this case, the gain control of an amplifier by a gain adjustment element may be performed on either all or some of the plurality of amplifiers. Still further, an amplifier which performs the gain adjustment by the first gain control signal Vc1 and an amplifier which performs the gain adjustment by the second gain control signal Vc2 are not necessarily the same and may be different from each other.

<First and Second Amplitudes>

In the above-described case and the case shown in FIG. 8C, the gain of the amplifier 20 obtained when the detection signal Vb is less than the first reference value Vth1 or when the detection signal Vb is greater than the second value Vth2 is lower than the gain of the amplifier 20 obtained when the detection signal Vb is between the first and second reference values Vth1 and Vth2.

However, the gain characteristics of the amplifier 20 vary depending not only on the first and second reference values Vth1 and Vth2 but also on the characteristics of the detection signal Vb and the first and second gain control signals Vc1 and Vc2, and the characteristics of the amplitude detector 10a, the comparators Com1 and Com2, and the first and second gain adjustment elements 30. Further, an actually implemented circuit does not necessarily produce characteristics as designed because of, for example, variations in manufacturing.

Therefore, it is possible that the gain of the amplifier 20 obtained when the detection signal Vb is less than the first reference value Vth1 or when the detection signal Vb is greater than the second reference value Vth2 becomes higher than the gain of the amplifier 20 obtained when the detection signal Vb is between the first and second reference values Vth1 and Vth2 (for example, it is possible that the gain of the amplifier 20 has a peak when the detection signal Vb is outside the range between the first and second reference values Vth1 and Vth2).

In the present embodiment, therefore, the gain characteristics of the amplifier 20 are defined with respect to the first and second amplitudes.

Figure 9A:
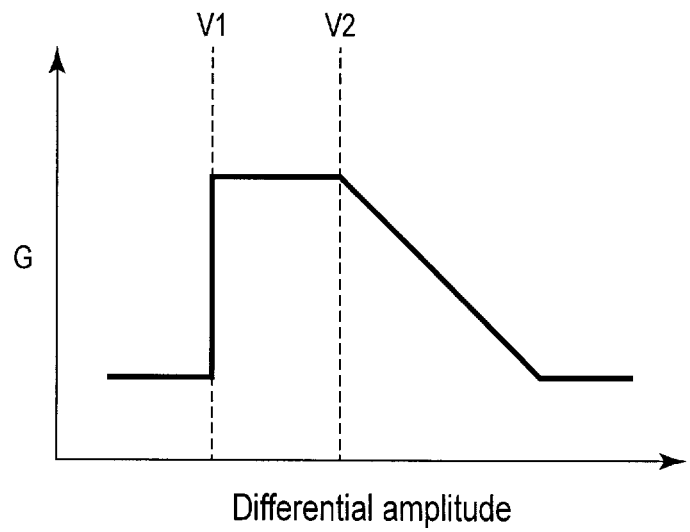
FIGS. 9A and 9B are diagrams showing the relationship between the amplitude of an input signal and the gain of an amplifier.

That is, as shown in FIG. 9A, the gain of the amplifier 20 obtained when the differential amplitude of input signals Va1 and Va2 is less than the first amplitude V1 or when the differential amplitude is greater than the second amplitude V2 is assumed to be lower than the gain of the amplifier 20 obtained when the differential amplitude is between the first and second amplitudes V1 and V2 or when the differential amplitude is either one of the first amplitude V1 and the second amplitude V2. The second amplitude V2 may be greater than the first amplitude V1 or may be, as shown in FIG. 8, equal to the first amplitude V1.

Note that the gain of the amplifier 20 obtained when the differential amplitude of input signals Va1 and Va2 is less than the first amplitude V1 or when the differential amplitude is greater than the second amplitude V2 is not necessarily increase or decrease uniformly and may have fluctuations relatively small as compared to the total change in the gain of the amplifier 20. Similarly, the gain of the amplifier 20 obtained when the differential amplitude of input signals Va1 and Va2 is between the first amplitude V1 and the second amplitude V2, the gain of the amplifier 20 may have fluctuations relatively small as compared to the total change in the gain of the amplifier 20.

The specific value of the first amplitude can be determined on the basis of, for example, the standard of an interface to be applied. For example, with respect to the interface standard specifying that the minimum signal amplitude is 100 mV, the first amplitude is set to be 100 mV or less. Further, if necessary, various circuit parameters as well as the first reference value Vth1 are adjusted to make the first amplitude 100 mV or less.

The specific value of the second amplitude can be determined on the basis of, for example, the gain characteristics of the amplifier 20. For example, if the internal signal or the output signal of the amplifier reaches the output limit (limit voltage) when the differential amplitude of the input signal is 200 mV or more, the second amplitude is set to be 200 mV or more (the reason for using the output limit of the amplifier as a reference will be described later). Further, if necessary, various circuit parameters as well as the second reference value Vth2 are adjusted to make the second amplitude 200 mV or more.

<Application Effect on Repetitious Burst Signal>

In the present embodiment, it is possible to improve the reliability of signal transmission in an amplifier configured to amplify a repetitious burst signal. Detailed descriptions will be presented below.

Figure 10:
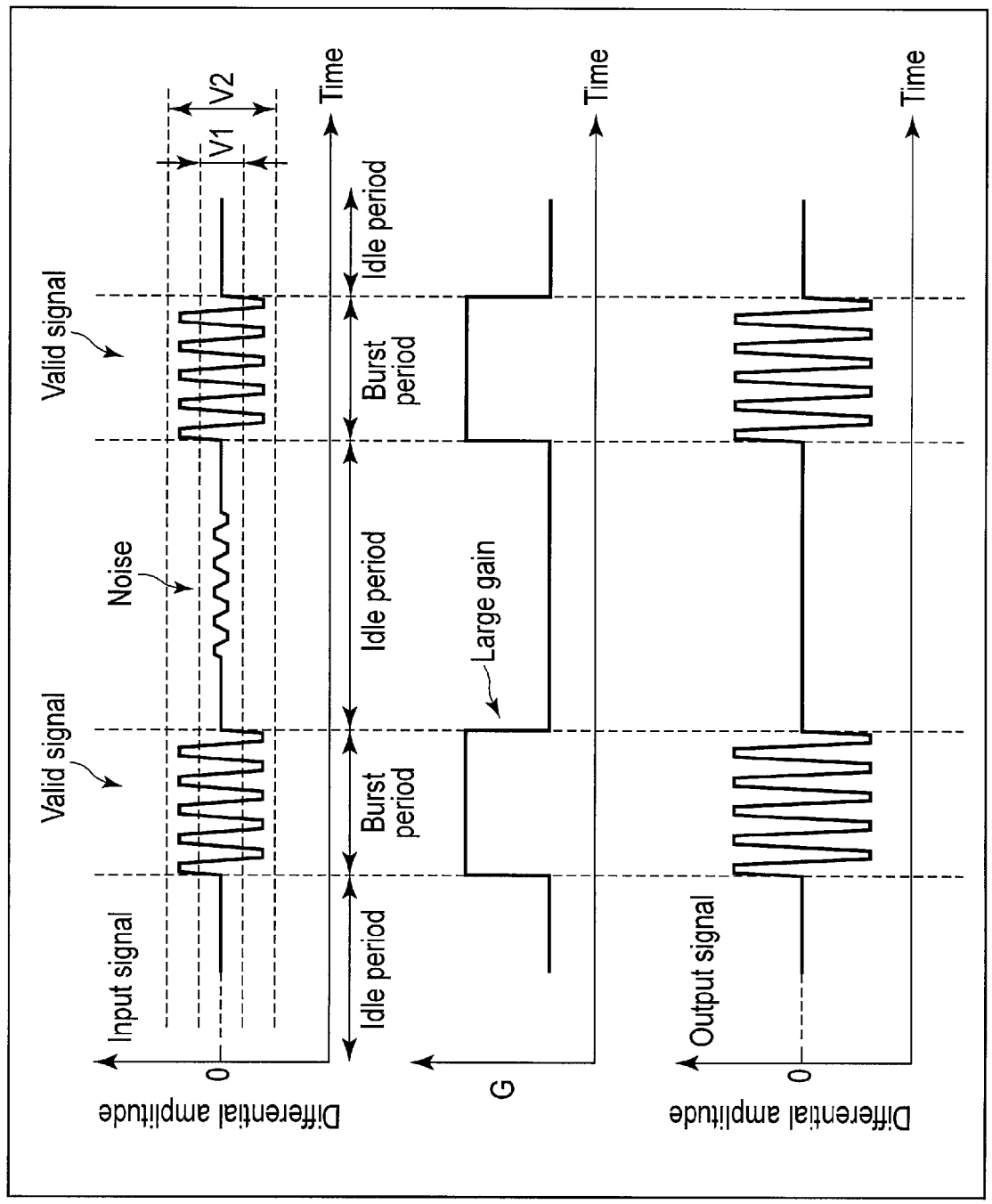
FIG. 10 and FIG. 11 are diagrams each showing an application effect on a repetitious burst signal.

With regard to a repetitious burst signal, FIG. 10 is considered. The repetitious burst signal of FIG. 10 includes a burst period in which the signal transitions between low and high repeatedly (for example, the pulse width of which is 1 ns and the period length of which is 100 ns) and an idle period in which the signal remains unchanged at the intermediate level between low and high (for example, the period length of which is 300 ns). The differential amplitude of the burst period (for example, 150 mV) is greater than the first amplitude V1 (for example, 100 mV) but less than the second amplitude V2 (for example, 200 mV).

Further, in the idle period, the differential amplitude includes small noise which is less than the first amplitude V1 (for example, the differential amplitude of which is 50 mV). The small noise is created, for example, by crosstalk of signals effective in the burst period, signal reflection due to an impedance mismatch, or the like.

First, the idle period will be described in detail. The differential amplitude of the idle period including the small noise is less than the first amplitude V1. Therefore, the gain of the amplifier 20 in the idle period (G: middle chart of FIG. 10) is low. As a result, the small noise included in the idle period will not appear in the output signal (lower chart of FIG. 10) or will be significantly small if ever the noise appears.

On the other hand, in conventional amplifiers configured to perform gain adjustment, there is the following relationship: as the input signal decreases, the gain increases, and as the input signal increases, the gain decreases. Therefore, the gain becomes maximum in the idle period containing no input signal. Further, in the idle period in which the differential input voltage is zero, the circuit is in a state of equilibrium, and thus the gain tends to become higher as compared with the case in which the differential input voltage is present. Therefore, when the idle period of the input signal contains the above-described small noise, this is amplified to the greatest extent, and consequently a signal and large noise which were not originally noticeable appear in the idle period of the output signal. As a result, it becomes difficult to understand the signal accurately in a receiving circuit, which leads to a problem that the reliability of signal transmission significantly decreases.

Next, the burst period will be described in detail. The differential amplitude of the burst period of FIG. 10 is greater than the first amplitude V1 but less than the second amplitude V2. Therefore, the gain of the amplifier 20 in the burst period is high. As a result, the signal of the burst period is amplified and output based on this gain.

Figure 11:
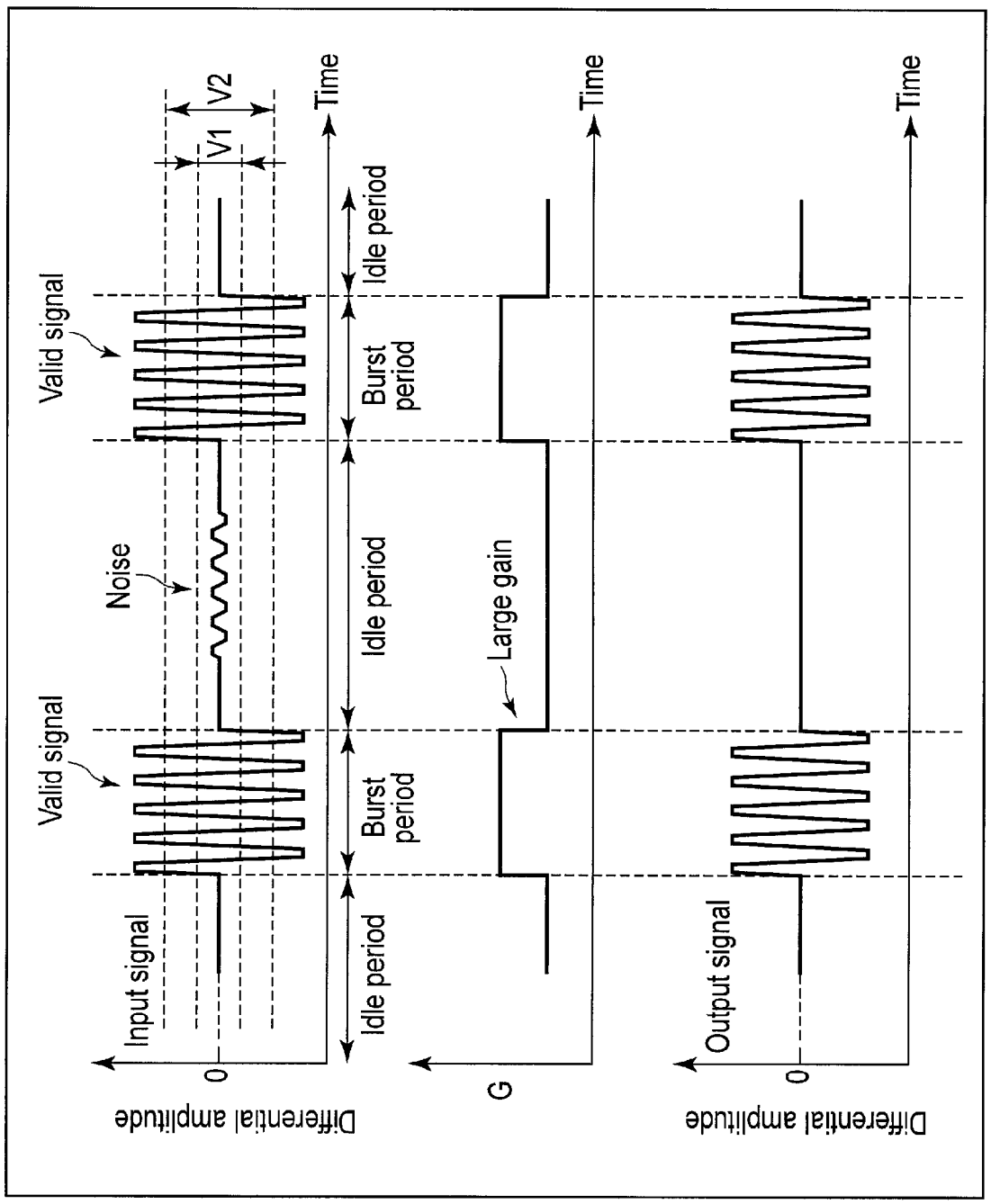

As another case, the repetitious burst signal of FIG. 11 will be considered. The burst signal of FIG. 11 is different from the burst signal of FIG. 10 in that the differential amplitude of the burst period is greater than the second amplitude V2 (for example, the differential amplitude is 250 mV).

In this case, as shown in the middle chart of FIG. 11, the gain of the amplifier 20 in the burst period becomes lower than that of FIG. 10. That is, although the input amplitude is large, the gain of the amplifier 20 is low, and therefore it is possible to make the amplitude of the output signal in the burst period similar to that of the FIG. 10 as shown in the lower chart of FIG. 11.

On the other hand, in amplifiers which do not perform gain adjustment, the gain is set to be always constant. Therefore, when the input amplitude in the burst period is large, the internal signal or the output signal of the amplifier reaches the output limit (limit voltage). Further, as the waveform in the burst period is distorted or the transition from the burst period to the idle period is slow (it takes time for the output signal to change from low or high to the intermediate level between low and high), the idle period is likely to disappear. As a result, it becomes difficult to understand the signal accurately in the receiving circuit, which leads to a problem that the reliability of signal transmission significantly decreases.

As described above, in the present embodiment, it is possible in an amplifier configured to amplify a repetitious burst signal to prevent the idle period from being influenced by small noise and to set an appropriate gain to the burst period based on the amplitude, and thus it becomes possible to significantly improve the reliability of signal transmission.

Note that the above-described repetitious burst signal includes, for example, an out-of-band (COB) signal conforming to the Serial Advanced Technology Attachment (SATA) standard or the Serial-Attached SCSI [Small Computer System Interface] (SAS) standard, a low-frequency periodic signal (LFPS) conforming to the Universal Serial Bus (USB) standard, a beacon signal conforming to the InfiniBand standard.

<Optimization of Gain Control Signal>

Figure 9B:
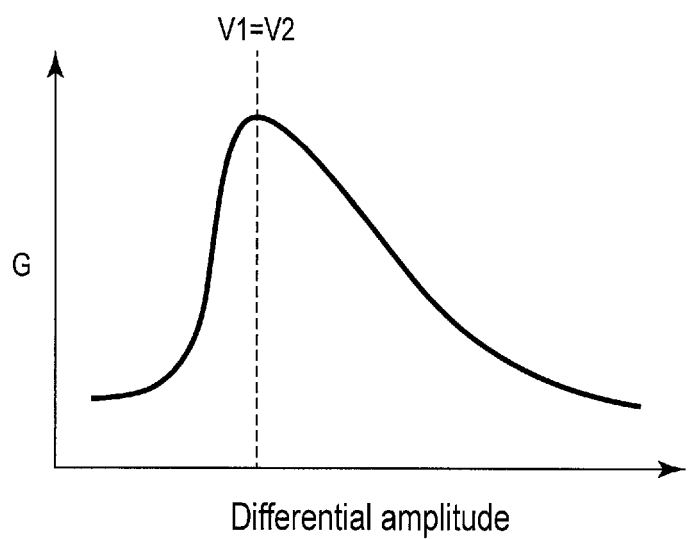

With regard to the gain of the amplifier 20, for example, as shown in FIGS. 9A and 9B, it is desirable that the gain (G) of the amplifier 20 obtained when the differential amplitude is less than the first amplitude V1 should change more suddenly than the gain (G) of the amplifier obtained when the differential amplitude is greater than the second amplitude V2. That is, with respect to the same amplitude change, it is preferable that the change (that is, the rate of change) of the gain of the amplifier 20 obtained when the differential amplitude is less than the first amplitude V1 be greater than the change (that is, the rate of change) of the gain of the amplifier 20 obtained when the differential amplitude is greater than the second amplitude V2.

Therefore, with regard to the first and second gain control signals Vc1 and Vc2, for example, it is preferable that the first gain control signal Vc1 should change more suddenly than the second gain control signal Vc2 with respect to the input voltage (Va1-Va2) as shown in FIG. 8B. That is, regarding the changes in the gain control signals with respect to the same input voltage change, it is preferable that the change (that is, the rate of change) of the first gain control signal Vc1 be greater than the change (that is, the rate of change) of the second gain control signal Vc2.

First, regarding the first gain control signal Vc1 used for switching the gain of the amplifier between the idle period and the burst period, if the gain (refer to, for example, the middle charts of FIGS. 10 and 11) has not been increased immediately after the burst period starts and the pulse at the front of the burst period could not have been amplified, there is a danger of losing the pulse at the front of the burst period. Therefore, when the detection signal Vb is close to the first threshold Vth1, it is desirable that the first gain control signal Vc1 should change more suddenly with respect to the change of the input amplitude.

Next, regarding the second gain control signal Vc2 used for adjusting the gain of the amplifier based on the amplitude of the burst period, if the gain control signal Vc2 follows small changes of the input amplitude, the amplitude of the output signal changes and this leads to a possible danger of creating jitters and noise. Therefore, it is desirable that the second gain control signal Vc2 should change more gradually with respect to the change of the input amplitude.

The methods of changing the first gain control signal Vc1 suddenly include increasing the gain or the band of the first comparator Com1 of FIG. 3, using a PMOS transistor having high responsivity (for example, having a small gate area [width and length] or a small threshold) as the first gain adjustment element M9 of FIG. 7, decreasing the ratio of the output capacity of the first comparator Com1 to the input capacity of the first gain adjustment element M9, adjusting the first reference value Vth1, and the like.

Further, the methods of changing the second gain control signal Vc2 gradually include decreasing the gain or the band of the second comparator Com2 of FIG. 3, using a PMOS transistor having low responsivity (for example, having a large gate area [width and length] or a large threshold) as the second gain adjustment element. M10 of FIG. 7, increasing the ratio of the output capacity of the second comparator Com2 to the input capacity of the second gain adjustment element M10, adjusting the second reference value Vth2, and the like.

Note that, when the detection signal Vb is less than the first threshold Vth1, it is desirable that the first gain control signal Vc1 should have a ground voltage (or a power-supply voltage if the first gain adjustment element M9 of FIG. 7 is an NMOS transistor) to make the gain of the amplifier the lowest. On the other hand, when the detection signal Vb is greater than the second threshold Vth2, it is desirable that the first gain control signal Vc1 should have a power-supply voltage (or a ground voltage if the second gain adjustment element M10 of FIG. 7 is an NMOS transistor) to make the gain of the amplifier maximum.

<Modified Example of Gain Control Signal Generator>

FIG. 12 is a diagram showing a modified example of the gain control signal generator.

The gain control signal generator of the modified example is different from the gain control signal generator of FIG. 3 in that the amplitude detector 10a outputs first and second detection signals Vb1 and Vb2. The first detection signal Vb1 is input to the first comparator Com1, and the second detection signal Vb2 is input to the second comparator Com2. The first comparator Com1 is configured to compare the first detection signal Vb1 and the first reference value vth1, and the second comparator Com2 is configured to compare the second detection signal Vb2 and the second reference value Vth2.

FIG. 13 is a diagram showing an example of the amplitude detector 10a of FIG. 12.

The amplitude detector 10a comprises PMOS transistors M1 and M2 and resistors R1 and R2 connected between two power-supply terminals Vdd and Vss. In contrast to the amplitude detector 10a of FIG. 4, two resistors are provided, the first detection signal Vb1 is output from output terminal Vc1 between PMOS transistors M1 and M2 and resistor R1, and the second detection signal Vb2 is output from output terminal Vo2 between resistors R1 and R2.

Figure 14A:
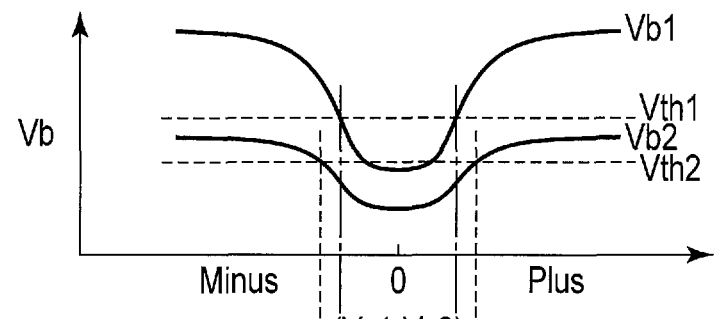
FIGS. 14A, 14B and 14C are diagrams showing the amplitude detection value, the gain control signal and the amplifier gain.
Figure 14B:
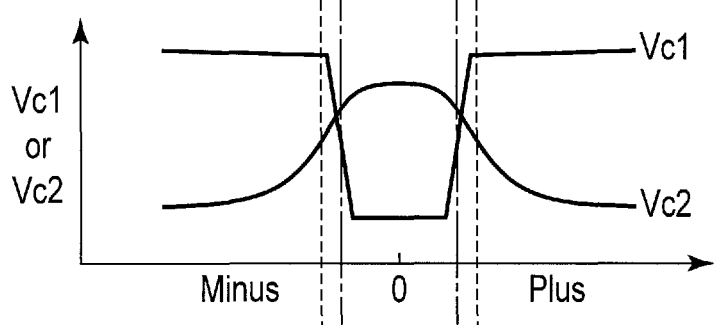
Figure 14C:
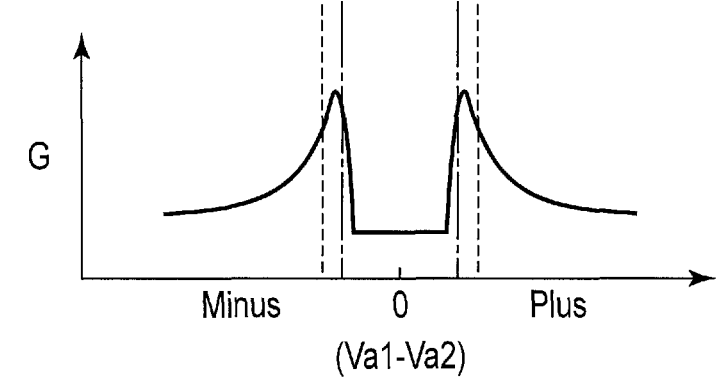

FIGS. 14A, 14B and 14C are diagrams showing an example of the input and output characteristics of the amplitude detector 10a of FIG. 13.

Regardless of whether the input voltage (Va1-Va2) changes positively or negatively from zero, output voltages Vb1 and Vb2 increase in a manner similar to that of the amplitude detector 10a of FIG. 4. In the present example, however, output voltage Vb1 is greater than output voltage of Vb2 and changes more suddenly than output voltage of Vb2 with respect to the same input voltage change.

Note that the amplitude detector 10a of FIG. 13 may use NMOS transistors the gates of which have been subjected to a predetermined bias voltage in place of resistors R1 and R1. Further, when the input signal is a single-ended signal, it is desirable that the input signal be converted from a single-ended signal into a differential signal and then input to the amplitude detector 10a of FIG. 13.

In the present example, in contrast to the case of the amplitude detector of FIG. 4, it becomes possible to adjust the first and second detection signals Vb1 and vb2 independently to optimize the first and second gain control signals Vc1 and Vc2 based on the desired gain characteristics of the amplifier 20. In this way, as compared to the amplitude detector of FIG. 4, the amplitude detector of the present example makes it possible to adjust the gain characteristics of the amplifier 20 more easily. Further, since a single amplitude detector is used in the present example in a manner similar to that of FIG. 4, there is an advantage of preventing an increase in energy consumption so that it becomes negligible or zero.

<Modified Example of Amplifier>

FIGS. 15 and 16 are diagrams showing modified examples of the amplifier. These are modified examples of the amplifier 20 of FIG. 7 and each amplifier 20 of the modified example features the gain adjustment elements 30 provided in the amplifier 20. Note that the components in FIGS. 15 and 16 similar to those of the amplifier 20 of FIG. 7 are denoted by the same reference numbers and symbols, and the descriptions thereof are omitted.

In FIG. 15, the first and second gain adjustment elements 30 (M11, M12, M13 and M14) are PMOS transistors connected to resistors R3 and R4 in parallel. The first gain adjustment elements M11 and M13 are controlled by the first gain control signal Vc1, and the second gain adjustment elements M12 and M14 are controlled by the second gain control signal Vc2.

More specifically, as the first and second gain control signals Vc1 and Vc2 decrease, the resistances between the sources and the drains of the first and second gain adjustment elements 30 (M11, M12, M13 and M14) decrease, and as the first and second gain control signals Vc1 and Vc2 increase, the resistances between the sources and the drains of the first and second gain adjustment elements 30 (M11, M12, M13 and M14) increase.

As described above, the gain of the amplifier 20 is roughly determined by multiplying the load resistance by the transconductance of NMOS transistors M7 and M8. Therefore, as the first and second gain control signals Vc1 and Vc2 decrease, the load resistance of the amplifier 20 decreases, and thus the gain decreases. Further, as the first and second gain control signals Vc1 and Vc2 increase, the load resistance of the amplifier 20 increases, and thus the gain increases.

As a result, as described with reference to FIG. 8, it is possible to make the gain of the amplifier 20 obtained when the detection signal Vb is less than the first reference value Vth1 or when the detection signal Vb is greater than the second reference value Vth2 lower than the gain of the amplifier 20 obtained when the detection signal Vb is between the first and second reference values Vth1 and Vth2.

In the example of FIG. 16, the first and second gain adjustment elements 30 (I11 and I12) are current sources connected to current source 12 in parallel. Each of these three current sources 12, I11 and I12 is composed of, for example, an NMOS transistor the gate of which has been subjected to a predetermined bias voltage. The first gain adjustment element I11 is controlled by the first control signal Vc1, and the second gain adjustment element I12 is controlled by the second gain control signal Vc2.

More specifically, as the first and second gain control signals Vc1 and Vc2 decrease, the current flowing in the first and second gain adjustment elements 30 (I11 and I12) decreases, and as the first and second gain control signals Vc1 and Vc2 increase, the current flowing in the first and second gain adjustment elements 30 (I11 and I12) increases.

As described above, the gain of the amplifier 20 is roughly determined by multiplying the load resistance by the transconductance of NMOS transistors M7 and M8. Therefore, as the first and second gain control signals Vc1 and Vc2 decrease, the current flowing in NMOS transistors M7 and M8 decreases and the transconductance therebetween decreases, and thus the gain decreases. Further, as the first and second gain control signals Vc1 and Vc2 increase, the current flowing in NMOS transistors M7 and M8 increases and the transconductance therebetween increases, and thus the gain increases.

Consequently, as described with reference to FIG. 8, it is possible to make the gain of the amplifier 20 obtained when the detection signal Vb is less than the first reference value Vth1 or when the detection signal Vb is greater than the second reference value Vth2 lower than the gain of the amplifier 20 obtained when the detection signal Vb is between the first and second reference values Vth1 and Vth2.

Note that, although the above-described gain adjustment elements of the amplifier 20 are all of the same kind, they are not necessarily limited to this kind and may be of various kinds.

(2) Second Embodiment

FIG. 17 is a diagram showing an amplification circuit of the second embodiment. The amplification circuit of the second embodiment is different from that of the first embodiment in that an assist signal generator 40 is provided. Note that the components similar to those of the first embodiment are denoted by the same reference numbers and symbols and the descriptions thereof are omitted.

Input signals Va1 and Va2 are input to the gain control signal generator 10 and to the amplifier 20.

The gain control signal generator 10 is configured to generate the first and second gain control signals Vc1 and Vc2 based on input signals Va1 and Va2. The assist signal generator 40 generates a third gain control signal Vc3 based on the first and second gain control signals Vc1 and Vc2.

The amplifier 20 is configured to amplify input signals Va1 and Va2 based on the gain controlled by the third gain control signal Vc3 and to output signals Vd1 and Vd2.

FIG. 18 is a diagram showing an example of the assist signal generator.

The assist signal generator 40 comprises NMOS transistor M15 and PMOS transistor M16 as a first transmission gate, PMOS transistor M17 and NMOS transistor M18 as a second transmission gate, and an inverter circuit INV.

To the gate terminal of the assist signal generator 40, the first gain control signal Vc1 is input. The second gain control signal Vc2 is input to the input terminal of the first transmission gate, and a ground voltage (Vss) is input to the input terminal of the second transmission gate. Further, the third gain control signal Vc3 is output from the output terminal.

Figure 19A:
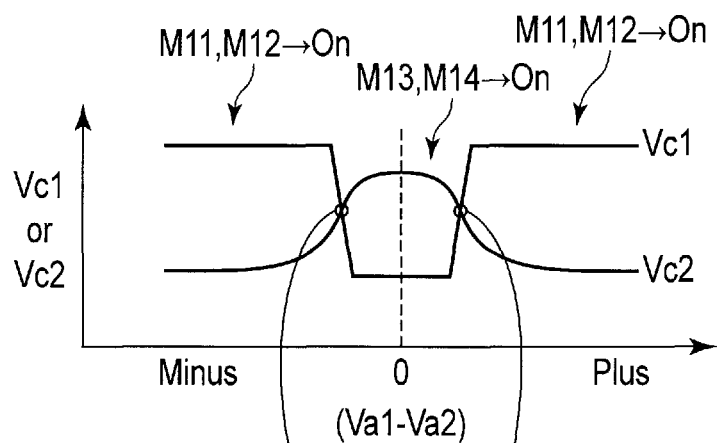
FIGS. 19A, 19B and 19C are diagrams showing the relationships among the gain control signal, an assist signal and the amplifier gain.

The first gain control signal Vc1 is assumed to change from a ground voltage to a power-supply voltage as shown in FIG. 19A.

Figure 19B:
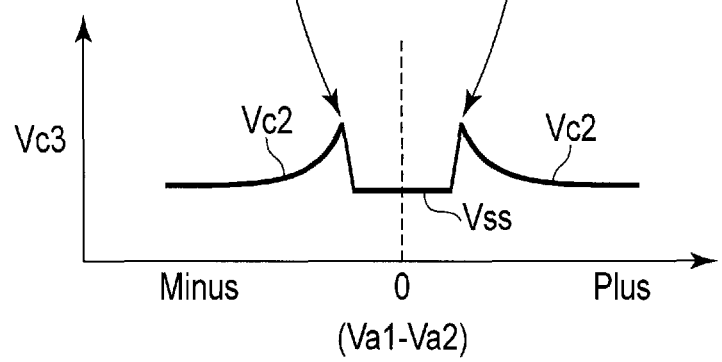
Figure 19C:
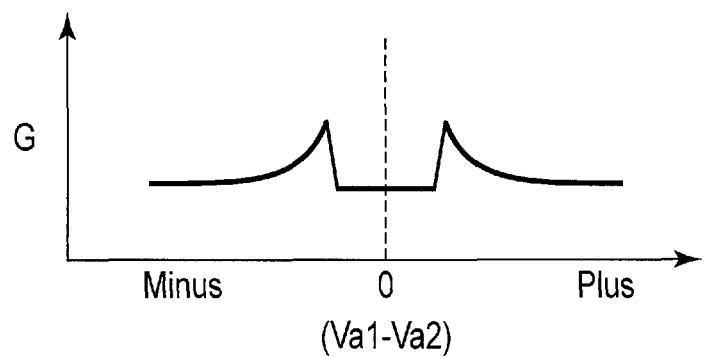

When the first gain control signal Vc1 has a ground voltage, the first transmission gate is in an off state and the second transmission gate is in an on state. Therefore, as shown in FIG. 19B, the assist signal generator 40 outputs the ground voltage input to the input terminal of the second transmission gate as the third gain control signal (assist signal) Vc3. Therefore, as shown in FIG. 19C, the gain (G) of the amplifier 20 of FIG. 17 becomes minimum.

On the other hand, when the first gain control signal Vc1 has a power-supply voltage, the first transmission gate is in an on state and the second transmission gate is an off state. Therefore, as shown in FIG. 19B, the assist signal generator 40 outputs the second gain control signal Vc2 input to the input terminal of the first transmission gate as the third gain control signal (assist signal) Vc3. Therefore, as shown in FIG. 19C, the gain of the amplifier 20 of FIG. 17 increases temporarily and decreases gradually.

FIG. 20 is a diagram showing an example of the amplifier.

The amplifier 20 is of a differential input type, and comprises NMOS transistors M7 and M8 configured to receive input signals Va1 and Va2, resistors R3 and R4, and current source 12. Output signals Vd1 and Vd2 are output from the drains of NMOS transistors M7 and M8. Note that, when the input signal is a single-ended signal, a reference voltage may be input to NMOS transistor M8 or the input signal may be converted into a differential signal in a stage prior to that of the amplifier 20 and then input to the amplifier 20.

The amplifier 20 further comprises a gain adjustment element 30 (M19) configured to change the gain based on the third control signal Vc3. The gain adjustment element 30 (M19) is a PMOS transistor connected between the drains of NMOS transistors M7 and M8, and to the gate of the gain adjustment element 30, the third gain control signal Vc3 is input.

As described above, the gain of the amplifier 20 is roughly determined by multiplying the load resistance by the transconductance of NMOS transistors M7 and M8. Therefore, as the third gain control signal Vc3 decreases, the load resistance of the amplifier 20 decreases, and thus the gain decreases. Further, as the third gain control signal Vc3 increases, the load resistance of the amplifier 20 increases, and thus the gain increases.

As a result, as shown in FIG. 19, the gain of the amplifier 20 becomes the lowest when the first gain control signal has a ground voltage. Further, when the first gain control signal has a power-supply voltage, the gain of the amplifier 20 temporarily increases along with the increase in input voltage (Va1-Va2) and decreases gradually in a manner similar to that of the second gain control signal Vc2.

With this configuration, in a manner similar to that of the first embodiment, it becomes possible to make the gain of the amplifier 20 obtained when the differential amplitude of the first signals Va1 and Va2 is less than the first amplitude V1 or when the differential amplitude is greater than the second amplitude V2 lower than the gain of the amplifier 20 obtained when the differential amplitude is between the first and second amplitudes V1 and V2.

In the present embodiment, since there is a single gain control signal, it suffices that a single gain adjustment element is provided in the amplifier. Therefore, it becomes possible, for example, to simplify the circuit structure, to prevent a decrease in the band of the amplifier caused by the parasitic capacity of the gain adjustment element, and the like.

(3) Third Embodiment

FIG. 21 is a diagram showing an amplification circuit of the third embodiment. The amplification circuit of the third embodiment is different from that of the first embodiment in that a plurality of gain adjustment elements are controlled by a single gain control signal. Note that the components similar to those of the first and second embodiments are denoted by the same numbers and symbols, and the descriptions thereof are omitted.

In the present embodiment, the gain control signal generator 10 is configured to generate a fourth gain control signal Vc4. The fourth gain control signal Vc4 may be any one of the first gain control signal Vc1, the second gain control signal Vc2 and the third gain control signal Vc3. The amplifier 20 comprises a plurality of various kinds of gain adjustment elements 30 and 50. The gain adjustment elements 30 and 50 are controlled by the fourth gain control signal Vc4, respectively.

Figure 22:
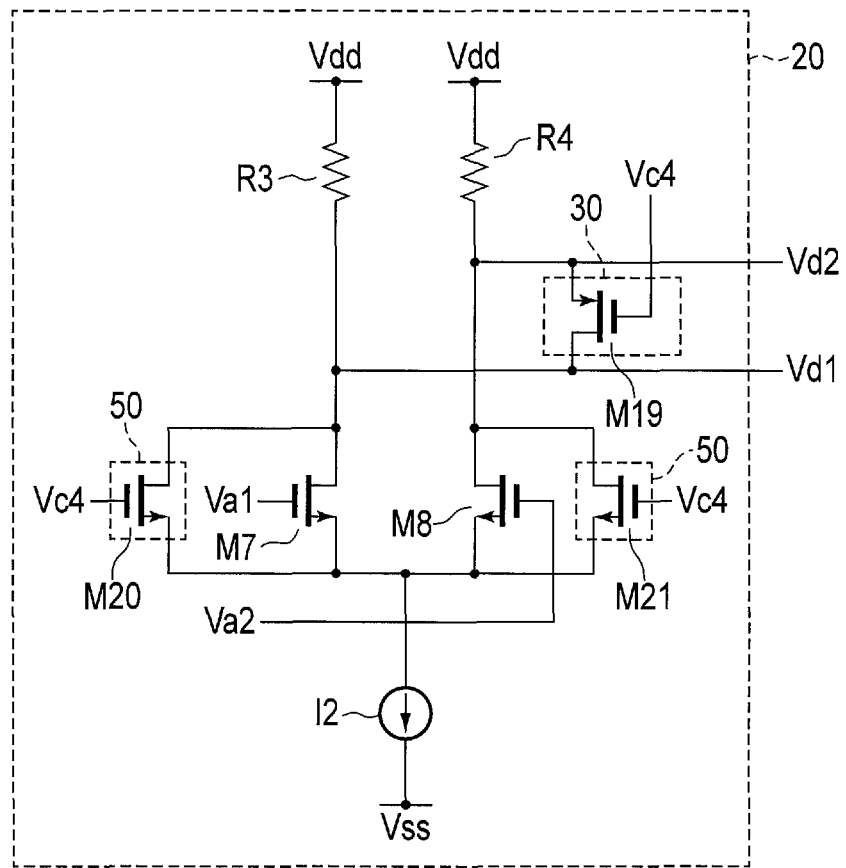
FIG. 22 is a diagram showing an example of the amplifier.

FIG. 22 is a diagram showing an example of the amplifier.

The amplifier 20 is of a differential input type, and comprises NMOS transistors M7 and M8 configured to receive input signals Va1 and Va2, resistors R3 and R4, and current source 12. Output signals Vd1 and Vd2 are output from the drains of NMOS transistors M7 and M8. Note that, when the input signal is a single-ended signal, a reference voltage may be input to NMOS transistor M8 or the input signal may be converted from a single-ended signal into a differential signal in a stage prior to that of the amplifier 20 and then input to the amplifier 20.

The amplifier 20 further comprises a first gain adjustment element 30 (M19) configured to change the gain by the first gain control signal Vc4, and second gain adjustment elements 50 (M20 and M21) configured to change the gain by the fourth gain control signal Vc4.

The first gain adjustment element 30 (M19) is a PMOS transistor connected between the drains of NMOS transistors M7 and M8, and to the gate of the first gain adjustment element 30 (M19), the fourth gain control signal Vc4 is input. Further, the second gain adjustment elements 50 (M20 and M21) are NMOS transistors connected to NMOS transistors M7 and M8 in parallel, and to the gates of the second gain adjustment elements 50 (M20 and M21), the fourth gain control signal Vc4 is input.

As described above, the gain of the amplifier 20 is roughly determined by multiplying the load resistance by the transconductance of NMOS transistors M7 and M8.

Here, as the fourth gain control signal Vc4 decreases, the resistance between the source and the drain of the first gain adjustment element 30 (M19) decreases and the load resistance of the amplifier 20 decreases, and thus the gain of the amplifier 20 is to decrease. Further, as the fourth gain control signal Vc4 increases, the resistance between the source and the drain of the first gain adjustment element 30 (M19) increases and the load resistance of the amplifier 20 increases, and thus the gain of the amplifier 20 is to increase.

On the other hand, when the fourth gain control signal Vc4 decreases, the drain current of the second gain adjustment elements 50 (M20 and M21) decreases and the current flowing in NMOS transistors M7 and M8 increases, and thus the transconductance of NMOS transistors M7 and M8 increases and the gain of the amplifier 20 is to increase. Further, when the fourth gain control signal Vc4 increases, the drain current of the second gain adjustment elements 50 (M21 and M21) increases and the current flowing in NMOS transistors M7 and M8 decreases, and thus the transconductance of NMOS transistors M7 and M8 decreases and the gain of the amplifier 20 is to decrease.

In this way, in response to the change of the fourth gain control signal Vc4, the first gain adjustment element 30 (M19) and the second gain adjustment elements 50 (M20 and M21) change the gain of the amplifier 20 in directions opposite to each other. Therefore, in a manner similar to those of the first and second embodiments, it is possible to make the gain of the amplifier 20 obtained when the differential amplitude of input signals Va1 and Va2 is less than the first amplitude V1 or when the differential amplitude is greater than the second amplitude V2 lower than the gain of the amplifier 20 obtained when the differential amplitude is between the first and second amplitudes V1 and V2.

In the present embodiment, it is possible to simplify the circuit structure of the gain control signal generator since it suffices that only a single gain control signal is provided, and consequently it becomes possible to reduce energy consumption.

(4) Fourth Embodiment

The fourth embodiment is directed to a signal transmission system to which the amplifier of any one of the first to third embodiments is applied.

Recently, in order to realize high-speed signal transmission in signal transmission systems used for data communication devices, a method of amplifying an electrical signal in a signal transmission path or a method of performing signal transmission by converting an electrical signal into an optical signal has been considered. However, since a signal is amplified in these methods, it is difficult in the case of repetitious burst signal transmission to transmit the signal accurately between an idle period and a burst period as described above, and therefore there is a problem that the reliability of signal transmission significantly decreases.

The amplifier of any one of the above-described first to third embodiments is applied to these signal transmission systems to realize highly-reliable high-speed signal transmission.

The signal transmission system of FIG. 23 will be described below as an example of application.

Figure 23:
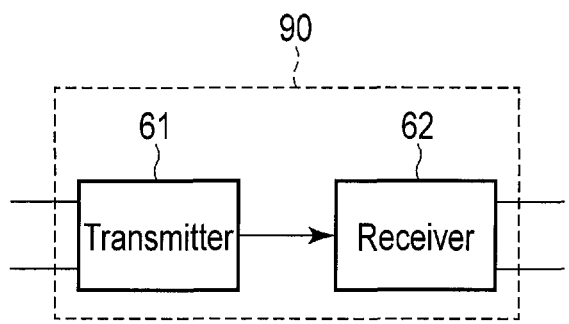
FIG. 23 is a diagram showing a signal transmission system as an application example.

A signal transmission system 90 of FIG. 23 comprises a transmitter 61 configured to transmit an electrical signal or an optical signal based on an electrical input signal, and a receiver 62 configured to receive an electrical signal or an optical signal and to generate an electrical output signal. An electrical signal is transmitted by an electrical cable comprising, for example, a copper conductor. An optical signal is transmitted by an optical cable comprising, for example, an optical fiber.

Note that the present embodiment describes a case in which a signal is transmitted in a single direction by using a transmitter or a receiver, but a signal may be transmitted in both directions by using a transceiver. In either case, there may be a single signal channel or may be a plurality of signal channels. Further, the number of signal channels in the transmission direction and the number of signal channels in the receiving direction may be different from each other.

<Example of Electrical Signal Transmission System>

First, an example of the signal transmission system using an electrical signal will be described.

The transmitter 61 for electrical signal transmission comprises, for example, as shown in FIG. 24, an input circuit (input) 91 configured to receive and amplify input signals Va1 and Va2, and an output circuit (output) 92 configured to output signals based on output signals Vd1 and Vd2 of the input circuit 91.

Input signals Va1 and Va2 of the input circuit 91 are, for example, differential signals including a repetitious burst signal, and are capable of transmitting data of, for example, up to 10 Gbps.

The input circuit 91 is configured, for example, to amplify input signals Va1 and Va2 the smallest differential amplitude of which is 100 mV, and to generate output signals Vd1 and Vd2 the differential amplitude of which is 500 mV. That is, the input circuit 91 comprises a gain of approximately 14.0 dB.

The gain of the input circuit 91 is controlled by the first and second gain control signals Vc1 and Vc2 from the gain control signal generator 10 of the above-described first embodiment. For example, when the input amplitude is 50 mV or less, the gain of the input circuit 91 is decreased to approximately 1.0 dB. Further, the gain is also gradually decreased when the input amplitude is 200 mV or more, and for example, the gain of the input circuit 91 obtained when the input amplitude is 400 mV is approximately 1.9 dB. In this way, as described above, it becomes possible to realize highly-reliable high-speed signal transmission.

Note that the gain of the input circuit 91 may be controlled by the third and fourth gain control signals Vc3 and Vc4 described in the above-described second and third embodiments.

The output circuit 92 is configured to output an electrical signal (having a differential amplitude of, for example, 400 mV) based on output signals Vd1 and Vd2 of the input circuit 91 to drive a transmission line (having a characteristic impedance of, for example, 100Ω to a differential signal).

Note that the gain adjustment by the gain control signal generator 10 may be performed by the output circuit 92. In that case, however, it is necessary to perform the gain adjustment before an internal signal reaches the output limit to avoid a problem caused thereby. For this reason, it is desirable that the gain adjustment be performed by the input circuit 91 as in the present example.

The transmitter 61 may comprise a circuit other than the input circuit 91 and the output circuit 92. For example, the transmitter 61 may comprise a serializer configured to convert parallel signals into serial signals, or a pre-emphasis circuit configured to modulate a signal in advance in consideration of a signal loss in a transmission line.

The receiver 62 may have a structure same as that of the transmitter 61 of FIG. 24.

That is, the receiver 62 comprises the input circuit 91 configured to receive and amplify input signals (received signals) Va1 and Va2, and the output circuit 92 configured to output signals based on output signals Vd1 and Vd2 of the input circuit 91.

The gain of the input circuit 91 is controlled by the first and second gain control signals Vc1 and Vc2 from the gain control signal generator 10 of the above-described first embodiment. In this way, as described above, it becomes possible to realize highly-reliable high-speed signal transmission.

The receiver 62 may comprise a circuit other than the input circuit 91 and the output circuit 92. For example, the receiver 62 may comprise, for example, a deserializer configured to convert serial signals into parallel signals, or an equalizer configured to compensate a signal loss in a transmission line.

Note that the present embodiment describes a signal transmission system using the transmitter 61 and the receiver 62, but the signal transmission system using an electrical signal may use only either one of the transmitter 61 and the receiver 62.

<Example of Optical Signal Transmission System>

Next, an example of the signal transmission system using an optical signal will be described.

The transmitter 61 for optical signal transmission comprises, for example, as shown in FIG. 25, an interface circuit (IF: interface) 64 configured to amplify input signals Va1 and Va2, a drive circuit (driver) 65 configured to generate an electrical signal based on output signals Vd1 and Vd2 of the interface circuit 64 to drive a light-emitting element 66, and the light-emitting element (for example, a vertical cavity surface emitting laser [VCSEL]) 66 configured to convert an electrical signal (current signal) into an optical signal.

Input signals Va1 and Va2 of the interface circuit 64 are, for example, differential signals including a repetitious burst signal, and are capable of transmitting data of, for example, up to 25 Gbps.

The interface circuit 64 is configured to amplify input signals Va1 and Va2 the differential amplitude of which is 100 mV and to generate output signals Vd1 and Vd2 the differential amplitude of which is 500 mV. That is, the interface circuit 64 has a gain of approximately 14.0 dB.

The gain of the interface circuit 64 is controlled by the first and second gain control signals Vc1 and Vc2 from the gain control signal generator 10 of the above-described first embodiment. For example, when the input amplitude is 50 mV or less, the gain of the interface circuit 64 is decreased to approximately 1.0 dB. Further, the gain is also gradually decreased when the input amplitude is 200 mV or more, and for example, the gain of the interface circuit 64 obtained when the input amplitude is 400 mV is approximately 1.9 dB. In this way, as described above, it becomes possible to realize highly-reliable high-speed signal transmission.

Note that the gain of the interface circuit 64 may be controlled by the third and fourth gain control signals Vc3 and Vc4 described in the above-described second and third embodiments.

The drive circuit 65 is configured to generate a current signal based on output signals Vd1 and Vd2 of the interface circuit 64 to drive the light-emitting element 66. The current signal includes, for example, a bias current (of, for example, 3 mA) to set an operating point of the light-emitting element 66, namely, a laser, and a demodulation current (of, for example, 5 mA) to demodulate optical output. That is, the drive circuit 65 has a transconductance of approximately 10 mS.

In this way, an optical signal (having an amplitude of, for example, 1 mW) is output from the light-emitting element 66. The optical signal is, for example, transmitted to the receiver 62 via an optical fiber.

In optical signal transmission in general, a single-channel signal is transmitted by a set of a light-emitting element and a light-receiving element to prevent increases in energy consumption and cost. Therefore, it is desirable that the output of the drive circuit 65 be a single-ended signal. However, it is also possible that the output of the drive circuit 65 is a differential signal and that a single-channel signal is transmitted by two sets of the light-emitting element and the light-receiving element.

The gain adjustment by the gain control signal generator 10 may be performed by the drive circuit 65. In that case, however, it is necessary to perform the gain adjustment before an internal signal reaches the output limit to avoid a problem caused thereby. For this reason, it is desirable that the gain adjustment be performed by the interface circuit 64 as in the present embodiment.

The receiver 62 for optical signal transmission comprises, for example, as shown in FIG. 26, a light-receiving element (for example, a p-i-n photodiode [PD: photodiode]) 67 configured to convert an optical signal into an electrical signal (current signal), a transimpedance amplifier [TIA] 68 configured to convert a current signal generated by the light-receiving element 67 into a voltage signal, a limiting amplifier (LA) 69 configured to amplify the output signal of the transimpedance amplifier 68, and an interface (IF) circuit 70 configured to drive a transmission line based on the output of the limiting amplifier 69.

The light-receiving element 67 is configured to receive an optical signal transmitted via an optical fiber and to generate a current signal (having an amplitude of, for example, 200 µA).

The transimpedance amplifier 68 is configured to convert the current output generated by the light-receiving element 67 into a voltage signal (having an amplitude of, for example, 40 mV. In this case, the gain of the transimpedance amplifier 68 is 200Ω.

As described above, in the optical transmission in general, a single-channel signal is transmitted by a set of a light-emitting element and a light-receiving element. Therefore, it is desirable that the transimpedance amplifier 68 should perform single-ended input. However, it is also possible that a single-channel signal is transmitted by two sets of the light-emitting element and the light-receiving element and that the transimpedance amplifier 68 performs differential input.

Further, the output signal of the transimpedance amplifier 68 in the present example is assumed to be a single-ended signal but may be a differential signal.

The limiting amplifier 69 is configured to convert the output of the transimpedance amplifier 68 from a single-ended signal into a differential signal by comparing and amplifying the output signal of the transimpedance amplifier 68 and a reference voltage Vref, and to amplify and output the converted signal. The differential amplitude of the output is, for example, 800 mV, and in this case, the gain of the limiting amplifier 69 is approximately 32 dB.

The limiting amplifier 69 comprises, for example, as shown in FIG. 27, five differential amplifiers 81 to 85 and the gain control signal generator 10.

The differential amplifier 81 in the first stage is configured to compare and amplify the output signal of the transimpedance amplifier 68 and the reference voltage Vref. The output signal of the differential amplifier 81 in the first stage is further amplified by the differential amplifiers in the second and the succeeding stages. In this way, conversion from a single-ended signal into a differential signal and amplification of a signal is performed.

The gain control signal generator 10 is configured to generate the gain control signals Vc1 and Vc2 based on output signals Va1 and Va2 of the differential amplifier 82 in the second stage to control the gains of the differential amplifiers 83 to 85 in the third to fifth stages. In this way, the gain of the limiting amplifier 69 is controlled, and thus it becomes possible to realize highly-reliable high-speed signal transmission.

Note that the gain of the limiting amplifier 69 may be controlled by the third and fourth gain control signals Vc3 and Vc4 described in the above-described second and third embodiments.

It is desirable that the output signal of the differential amplifiers in the second and the succeeding stages be used as the input signal of the gain control signal generator 10 as shown in FIG. 27.

This is because, since the output signal of the differential amplifier in the first stage has a normal phase signal and a reverse signal misaligned with each other or having amplitudes different from each other, it is possible that the gain control signal generator 10 fail to detect the differential amplitude accurately.

Further, it is necessary to perform the gain adjustment before an internal signal reaches the output limit to avoid a problem caused thereby. Therefore, in the present example, the output signal of the differential amplifier in the second stage is used as the input signal of the gain control signal generator 10.

Although it is also possible to perform the gain adjustment of the gain control signal generator 10 in the interface circuit 70, it is desirable that the gain adjustment be performed in the limiting amplifier 69 to avoid a problem caused when the internal signal reaches the output limit.

The interface circuit 70 is configured to output an electrical signal (having a differential amplitude of, for example, 400 mV) based on the output of the limiting amplifier 69 to drive a transmission line (having a characteristic impedance of, for example, 1005 to a differential signal).

<Example of Application to Storage System>

FIG. 28 is a diagram showing an example of application of the above-described signal transmission to a storage system.

The storage system comprises a device (such as a solid-state disk [SSD], or a hard disk) 71 and a host (such as a computer or a server) 72 configured to read and write data to the device 71 which are connected with each other by the above-described signal transmission system 90.

In the storage system, the device 71 and the host 72 are connected in an interface standard such as the above-described SATA or SAS. In these interface standards, since an OOB signal as a repetitious burst signal is used and amplified, it is difficult to transmit the signal accurately between the idle period and the burst period, and thus a problem of a significant decrease in the reliability of signal transmission is likely to be emerged.

However, in the signal transmission system of the present example, it is possible to improve the reliability of signal transmission significantly by suppressing the influence of small noise in the idle period and providing the burst period with an appropriate gain based on the amplitude.

(5) Other Modified Example

As described above, according to the embodiments, it is possible to improve the reliability of signal transmission.

Note that the present invention is not necessarily limited to each of the above-described embodiment. Blocks and circuits described in the embodiments, circuit elements in the blocks or circuits, and other components are presented by way of example only and may be appropriately replaced with substitutes having similar functions.

For example, although the case of using an MOS transistor has been described above, a transistor other than the MOS transistor such as a field-effect transistor, a bipolar transistor or a Bi-CMOS transistor may be used as well. Further, various light-emitting elements such as a light-emitting diode or a semiconductor laser may be used as the light-emitting element. Still further, various light-receiving elements such as a PIN photodiode, an MSM photodiode, an avalanche photodiode, or a photoconductor may be used as the light-receiving element.

The number of the reference values and the comparators are assumed to be two in the embodiments but may be three or more.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An amplification circuit comprising:
  an amplifier having a gain and amplifying an input signal based on the gain, the input signal including a burst period in which the input signal transits between a low level and a high level repeatedly and an idle period in which the input signal remains unchanged at an intermediate level between the low level and the high level; and
  a gain control signal generator controlling the gain based on an amplitude of the input signal,
  wherein:
  the gain obtained when the amplitude of the input signal is less than a first amplitude value and when the amplitude of the input signal is greater than a second amplitude value is lower than the gain obtained when the amplitude of the input signal is between the first and second amplitude values or when the amplitude of the input signal is one of the first and second amplitude values,
  the first amplitude value is less than the amplitude of the input signal in the burst period, and
  the second amplitude value is greater than or equal to the first amplitude value.

2. The circuit of claim 1, wherein:
  the gain control signal generator comprises an amplitude detector detecting the amplitude of the input signal, and first and second comparators comparing an output of the amplitude detector with first and second reference values and to generate first and second gain control signals,
  the amplifier comprises first and second gain adjustment elements adjusting the gain based on the first and second gain control signals,
  the gain obtained when the amplitude of the input signal is less than the first amplitude value is lower than the gain obtained when the amplitude of the input signal is between the first and second amplitude values or when the amplitude of the input signal is one of the first and second amplitude values, by the first control signal and the first gain adjustment element, and
  the gain obtained when the amplitude of the input signal is greater than the second amplitude value is lower than the gain obtained when the amplitude of the input signal is between the first and second amplitude values or when the amplitude of the input signal is one of the first and second amplitude values, by the second gain control signal and the second gain adjustment element.

3. The circuit of claim 1, wherein:
  the gain control signal generator comprises an amplitude detector detecting the amplitude of the input signal, first and second comparators comparing an output of the amplitude detector with first and second reference values and to generate first and second gain control signals, and a first signal generator generating a third gain control signal based on the first and second gain control signals,
  the amplifier comprises a gain adjustment element adjusting the gain based on the third gain control signal, and
  the gain obtained when the amplitude of the input signal is less than the first amplitude or when the amplitude of the input signal is greater than the second amplitude is lower than the gain obtained when the amplitude of the input signal is between the first and second amplitude values or when the amplitude of the input signal is one of the first and second amplitude values, by the third gain control signal and the gain adjustment element.

4. The circuit of claim 1, wherein:
the gain control signal generator comprises a second signal generator generating a fourth gain control signal,
the amplifier comprises first and second gain adjustment elements adjusting the gain based on the fourth gain control signal,
the gain obtained when the amplitude of the input signal is less than the first amplitude value is lower than the gain obtained when the amplitude of the input signal is between the first and second amplitude values or when the amplitude of the input signal is one of the first and second amplitude values, by the fourth gain control signal and the first gain adjustment element, and
the gain obtained when the amplitude of the input signal is greater than the second amplitude value is lower than the gain obtained when the amplitude of the input signal is between the first and second amplitude values or when the amplitude of the input signal is one of the first and second amplitude values, by the fourth gain control signal and the second gain adjustment element.

5. The circuit of claim 1, wherein a rate of a change of the gain obtained when the amplitude of the input signal is less than the first amplitude value is higher than a rate of a change of the gain obtained when the amplitude of the input signal is greater than the second amplitude value.

6. The circuit of claim 1, wherein the second amplitude value is equal to the first amplitude value.

7. The circuit of claim 1, wherein the second amplitude value is greater than the first amplitude value.

8. The circuit of claim 7, wherein the gain of the amplifier obtained when the amplitude of the input signal is between the first and second amplitude values is substantially constant.

9. A transmitter comprising:
a light-emitting element converting a current signal into an optical signal;
a first amplifier as an interface inputting a voltage signal; and
a second amplifier generating the current signal based on an output signal of the first amplifier,
wherein the first amplifier is the amplifier of claim 1 and has the gain controlled by the gain control signal generator of claim 1.

10. A receiver comprising:
a light-receiving element converting an optical signal into a current signal;
a first amplifier converting the current signal into a voltage signal;
a second amplifier hanging the voltage signal within a predetermined range; and
a third amplifier as an interface inputting the voltage signal from the second amplifier,
wherein the second amplifier is the amplifier of claim 1 and has the gain controlled by the gain control signal generator of claim 1.

11. A photoelectric converter for executing signal transmission between first and second devices by using an optical signal, the photoelectric converter comprising:
a first converter converting the optical signal into an electrical signal; and
a second converter converting the electrical signal to the optical signal,
wherein at least one of the first and second converters comprises the amplification circuit of claim 1.

12. An amplification circuit comprising:
an amplifier having a gain and amplifying an input signal based on the gain; and
a gain control signal generator controlling the gain based on an amplitude of the input signal,
wherein:
the gain obtained when the amplitude of the input signal is less than a first amplitude value and when the amplitude of the input signal is greater than a second amplitude value is lower than the gain obtained when the amplitude of the input signal is between the first and second amplitude values or when the amplitude of the input signal is one of the first and second amplitude values;
the second amplitude value is greater than or equal to the first amplitude value;
the gain control signal generator comprises an amplitude detector detecting the amplitude of the input signal, and first and second comparators comparing an output of the amplitude detector with first and second reference values and to generate first and second gain control signals;
the amplifier comprises first and second gain adjustment elements adjusting the gain based on the first and second gain control signals;
the gain obtained when the amplitude of the input signal is less than the first amplitude value is lower than the gain obtained when the amplitude of the input signal is between the first and second amplitude values or when the amplitude of the input signal is one of the first and second amplitude values, by the first control signal and the first gain adjustment element; and
the gain obtained when the amplitude of the input signal is greater than the second amplitude value is lower than the gain obtained when the amplitude of the input signal is between the first and second amplitude values or when the amplitude of the input signal is one of the first and second amplitude values, by the second gain control signal and the second gain adjustment element.

13. The circuit of claim 12, wherein a rate of a change of the gain obtained when the amplitude of the input signal is less than the first amplitude value is higher than a rate of a change of the gain obtained when the amplitude of the input signal is greater than the second amplitude value.

14. The circuit of claim 12, wherein the second amplitude value is equal to the first amplitude value.

15. The circuit of claim 12, wherein the second amplitude value is greater than the first amplitude value.

16. An amplification circuit comprising:
an amplifier having a gain and amplifying an input signal based on the gain; and
a gain control signal generator controlling the gain based on an amplitude of the input signal,
wherein:
the gain obtained when the amplitude of the input signal is less than a first amplitude value and when the amplitude of the input signal is greater than a second amplitude value is lower than the gain obtained when the amplitude of the input signal is between the first and second amplitude values or when the amplitude of the input signal is one of the first and second amplitude values;
the second amplitude value is greater than or equal to the first amplitude value;
the gain control signal generator comprises an amplitude detector detecting the amplitude of the input signal, first and second comparators comparing an output of the amplitude detector with first and second reference values and to generate first and second gain control signals, and a first signal generator generating a third gain control signal based on the first and second gain control signals;

the amplifier comprises a gain adjustment element adjusting the gain based on the third gain control signal; and the gain obtained when the amplitude of the input signal is less than the first amplitude or when the amplitude of the input signal is greater than the second amplitude is lower than the gain obtained when the amplitude of the input signal is between the first and second amplitude values or when the amplitude of the input signal is one of the first and second amplitude values, by the third gain control signal and the gain adjustment element.

17. The circuit of claim 16, wherein a rate of a change of the gain obtained when the amplitude of the input signal is less than the first amplitude value is higher than a rate of a change of the gain obtained when the amplitude of the input signal is greater than the second amplitude value.

18. The circuit of claim 16, wherein the second amplitude value is equal to the first amplitude value.

19. The circuit of claim 16, wherein the second amplitude value is greater than the first amplitude value.

* * * * *